(12) United States Patent
Klemm et al.

(10) Patent No.: US 8,294,115 B2
(45) Date of Patent: Oct. 23, 2012

(54) LINEAR ELECTRON SOURCE, EVAPORATOR USING LINEAR ELECTRON SOURCE, AND APPLICATIONS OF ELECTRON SOURCES

(75) Inventors: Guenter Klemm, Nidda (DE); Volker Hacker, Altenstadt-Oberau (DE); Hans-Georg Lotz, Gruendau-Rothenbergen (DE)

(73) Assignee: Applied Materials, Inc., Santa Clara, CA (US)

( * ) Notice: Subject to any disclaimer, the term of this patent is extended or adjusted under 35 U.S.C. 154(b) by 493 days.

(21) Appl. No.: 12/272,477

(22) Filed: Nov. 17, 2008

(65) Prior Publication Data

US 2009/0159811 A1 Jun. 25, 2009

Related U.S. Application Data

(60) Provisional application No. 61/016,330, filed on Dec. 21, 2007.

(30) Foreign Application Priority Data

Dec. 21, 2007 (EP) .................................... 07024958

(51) Int. Cl.
*G21K 1/08* (2006.01)
*H01J 3/14* (2006.01)
*H01J 3/26* (2006.01)
*H01J 49/42* (2006.01)

(52) U.S. Cl. .............. 250/396 R; 250/492.3; 250/492.1; 250/427; 315/111.21; 315/111.41; 315/111.81; 219/121.48; 134/1.1

(58) Field of Classification Search .............. 250/396 R, 250/492.3, 492.1, 427; 315/111.21, 111.41, 315/111.81; 219/121.48; 134/1.1
See application file for complete search history.

(56) References Cited

U.S. PATENT DOCUMENTS

| 3,430,091 A | 2/1969 | Davis |
| 3,486,064 A | 12/1969 | Stauffer |
| 3,497,743 A | 2/1970 | Walch et al. |
| 3,588,565 A | 6/1971 | Trump |

(Continued)

FOREIGN PATENT DOCUMENTS

| GB | 1 375 211 | 11/1974 |
| GB | 1 418 693 | 12/1975 |
| WO | 2007/045110 | 4/2007 |

OTHER PUBLICATIONS

S.V. Denbnovetsky et al article, "Investigation of Forming of Electron Beam in Glow Discharge Electron Guns With Additional Electrode." IEEE, Int. Symp. on Discharges and Electrical Insulation in Vacuum-Eindhoven, 1998, pp. 637-640.

(Continued)

*Primary Examiner* — Jack Berman
*Assistant Examiner* — Meenakshi Sahu
(74) *Attorney, Agent, or Firm* — Patterson & Sheridan, LLP

(57) ABSTRACT

A linear plasma electron source is provided. The linear plasma electron source includes a housing acting as a first electrode, the housing having side walls a slit opening in the housing for trespassing of a electron beam, the slit opening defining a length direction of the source, a second electrode being arranged within the housing and having a first side facing the slit opening, the first side being spaced from the slit opening by a first distance, wherein the length of the electron source in the length direction is at least 5 times the first distance, and at least one gas supply for providing a gas into the housing.

23 Claims, 9 Drawing Sheets

U.S. PATENT DOCUMENTS

| | | | |
|---|---|---|---|
| 4,209,702 A * | 6/1980 | Shirai et al. | 250/396 ML |
| 4,647,818 A * | 3/1987 | Ham | 315/111.21 |
| 4,910,435 A * | 3/1990 | Wakalopulos | 315/111.31 |
| 4,987,285 A * | 1/1991 | Dallavalle et al. | 219/121.54 |
| 2002/0015466 A1* | 2/2002 | Akiba et al. | 376/427 |
| 2009/0159818 A1* | 6/2009 | Klemm et al. | 250/492.3 |
| 2009/0161719 A1* | 6/2009 | Klemm et al. | 373/13 |

OTHER PUBLICATIONS

PCT International Search Report dated Jan. 30, 2009 for International Application No. PCT/EP2008/065703.

* cited by examiner

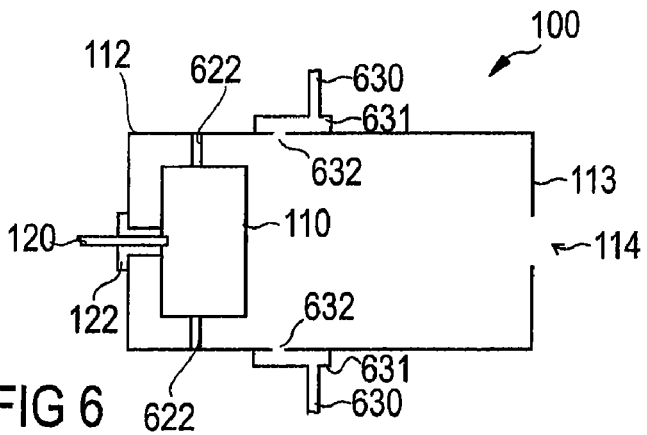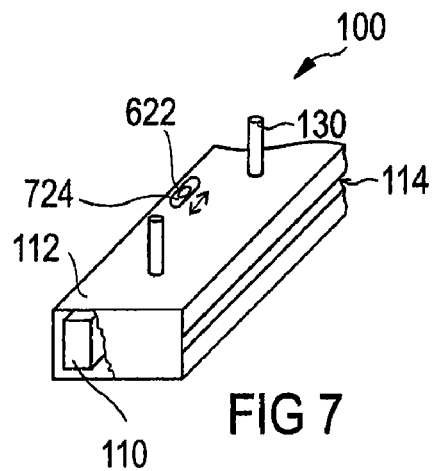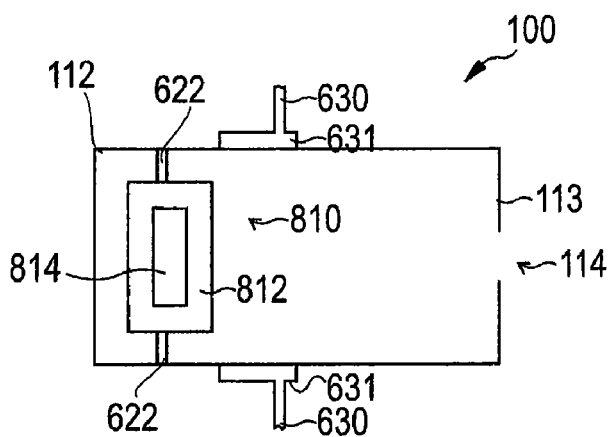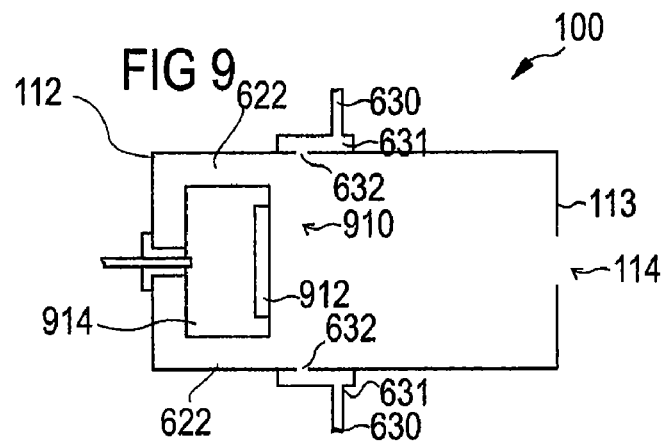

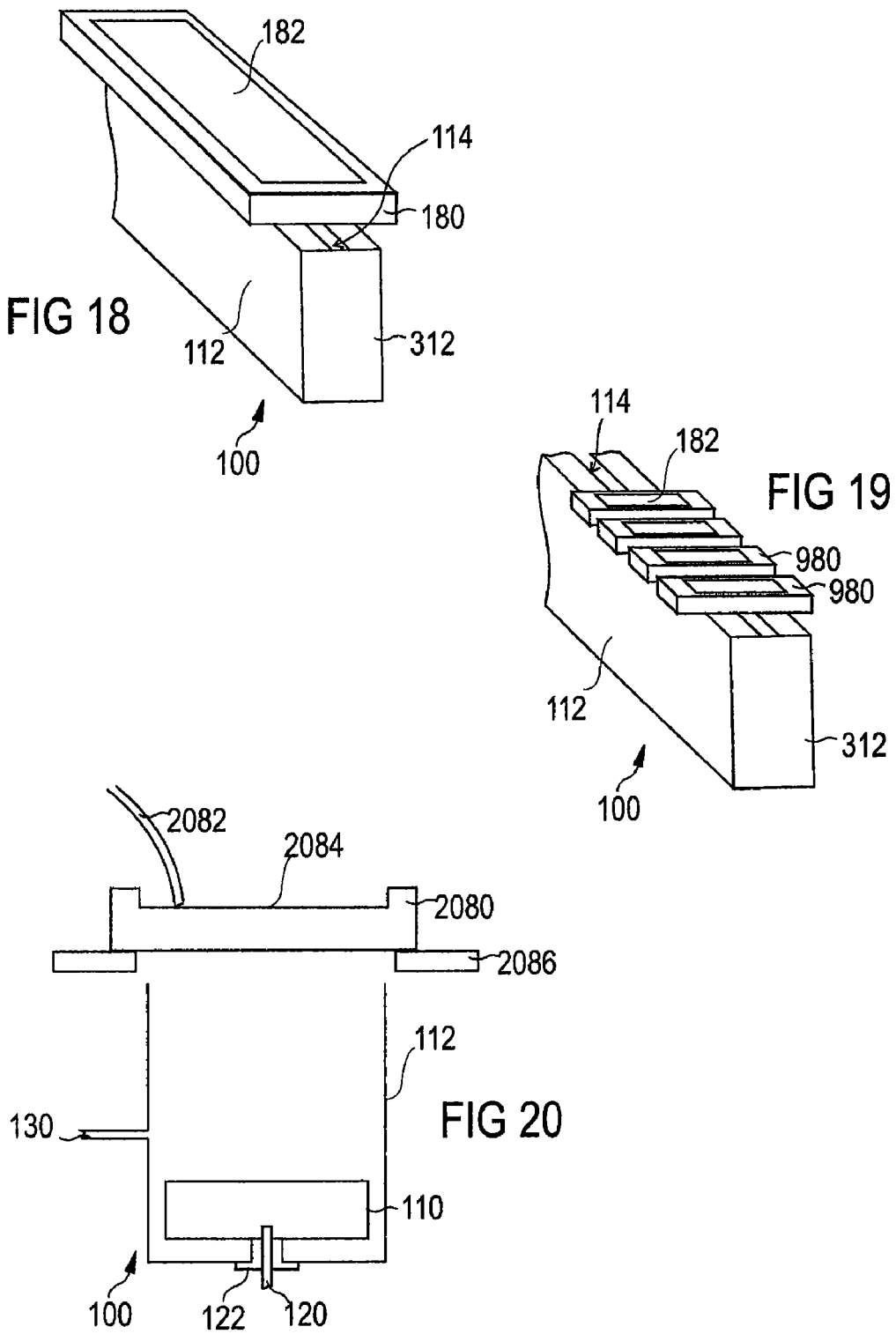

LINEAR ELECTRON SOURCE, EVAPORATOR USING LINEAR ELECTRON SOURCE, AND APPLICATIONS OF ELECTRON SOURCES

CROSS-REFERENCE TO RELATED APPLICATIONS

This application claims benefit of U.S. Provisional Patent Application Ser. No. 61/016,330, filed Dec. 21, 2007, which is herein incorporated by reference. This application claims priority to European Patent Application Serial Number 07024958.6, filed Dec. 21, 2007, which is herein incorporated by reference.

FIELD OF THE INVENTION

The invention relates to an electron source and a method of operating an electron source. In particular, it relates to a linear electron source for producing a linear electron beam with a plurality of electron energies with a distribution of energies. Further, it relates to applications for electron sources and systems making use of an electron source.

BACKGROUND OF THE INVENTION

Electron sources are known from a plurality of fields. Thereby, for example, electron beams are used for material modification, charging of surfaces, imaging of samples, and the like.

Modern manufacturing processes for capacitors on large area substrates or webs, for manufacturing of large area foils, for manufacturing of thin-film solar cells, and the like have a tendency towards decreasing manufacturing costs by enlarging the substrates or webs. Further, substrate sizes are increased to speed up manufacturing processes. In order to increase the throughput of a manufacturing apparatus, the energy density provided by a source onto a substrate, foil, sheets or web that is required for certain processes should also be increased.

For example, manufacturing of ceramic and electrolyte capacitors on foils by sputtering deposition processes can be applied. During deposition of the materials on the foil, heat is generated that needs to be reduced by contacting the foil to a cooled roller. Thereby, cooling of the foil depends on the contact of the foil to the roller. The contact is often realized by electrostatic forces. Thereby, the surface of the foil can be charged by an electron source. For charging the surface of a foil, for example, electron flood guns can be applied.

The desire to up-size manufacturing apparatuses and to increase the manufacturing speed of foils, sheets, films, electronic components, and the like make it desirable to improve the manufacturing apparatuses.

SUMMARY

In light of the above, a linear electron source and a method of manufacturing a linear electron source are provided.

Further advantages, features, aspects and details are apparent from the dependent claims, the description and drawings.

According to one embodiment, a linear plasma electron source is provided. The source includes a housing acting as a first electrode, the housing having side walls, a slit opening in the housing for trespassing of an electron beam, the slit opening defining a length direction of the source, a second electrode being arranged within the housing and having a first side facing the slit opening, the first side being spaced from the slit opening by a first distance, wherein the length of the electron source in the length direction is at least 5 times the first distance, and at least one gas supply for providing a gas into the housing.

According to another embodiment, a method manufacturing a linear plasma electron source is provided. The method includes manufacturing a housing acting as a first electrode and having a slit opening defining a length direction, providing a second electrode in the housing with a first side adapted for facing the slit opening and being spaced from the slit opening by a first distance, wherein the second electrode has second further sides adapted for facing side walls, and third further sides adapted for facing the housing, defining predetermined separation spaces between the second further side of the second electrode and the housing side ails and the third further sides and the housing, mounting the second electrode in the housing with a length of the second electrode in the length direction being at least 1 mm smaller than the predetermined separation space between the second further side and the housing side wall, and connecting at least one gas supply to the housing.

According to yet another embodiment, an evaporation apparatus for evaporating a material to be deposited is provided, The apparatus includes at least one evaporation crucible having a body with an area for receiving the material to be deposited at one side, a linear electron source being positioned adjacent to the evaporation crucible for impingement of an electron beam on another side, The linear electron source includes a housing acting as a first electrode, the housing having side walls, a slit opening in the housing for trespassing of an electron beam, the slit opening defining a length direction of the source, a second electrode being arranged within the housing and having a first side facing the slit opening, and at least one gas supply for providing a gas into the housing.

According to a further embodiment, a method of charging a web or foil is provided. The method includes guiding a web or foil having a thickness of 10 μm or larger with at least on roller, providing a linear electron source having a housing acting as an anode, the housing having side walls; a slit opening in the housing for trespassing of a linear electron beam, the slit opening defining a length direction of the source; a cathode being arranged within the housing and having a first side facing the slit opening; at least one gas supply for providing a gas into the housing; and a power supply for providing a high voltage between the anode and the cathode, emitting the linear electron beam, wherein the high voltage is adjusted for providing an electron energy to implant electrons of the electron beam within the web or foil.

According to an even further embodiment a method of heating or cleaning a web or foil is provided. The method includes providing a linear plasma electron source having a housing acting as an anode, the housing having side walls; a slit opening in the housing for trespassing of an electron beam, the slit opening defining a length direction of the source, a cathode being arranged within the housing and having a first side facing the slit opening; at least one gas supply for providing a gas into the housing; and a power supply for providing a high voltage between the anode and the cathode, guiding the web or foil movably in front of the slit opening, and emitting a linear electron beam from the linear plasma electron source.

Embodiments are also directed at apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, wherein:

FIG. 6 shows a schematic view of a linear electron source having a supported cathode and gas inlet means for uniform gas insertion according to embodiments described herein;

FIG. 7 shows a schematic view further illustrating a linear electron source with cathode support structures according to embodiments described herein;

FIG. 8 shows a schematic view a linear electron source having support structures and a cathode with two portions according to embodiments described herein;

FIG. 9 shows a view of a linear electron source having a further cathode with two portions according to embodiments described herein;

FIG. 18 shows a schematic view illustrating an evaporation apparatus using a linear electron source according to embodiments described herein;

FIG. 19 shows a schematic view illustrating further embodiments of an evaporation apparatus for using a linear electron source according to embodiments described herein;

FIG. 20 shows a schematic view illustrating further aspects of an evaporation apparatus using a linear electron source according to embodiments described herein.

DETAILED DESCRIPTION OF THE INVENTION

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Figure 1:
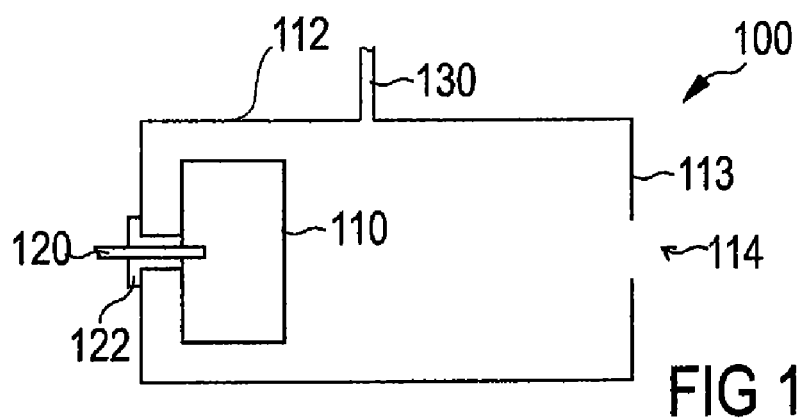
FIG. 1 shows a schematic cross-sectional view of a linear electron source according to embodiments described herein.

Embodiments of the present invention relate to linear electron sources and method of operating linear electron sources, which can be used for a plurality of applications. Thereby, the length and/or the height of the cathode is increased for improving modern manufacturing methods of films, sheets, substrates, webs, and the like. FIG. 1 illustrates embodiments of a linear electron source 100. Thereby, FIG. 1 shows a schematic cross-sectional view. The linear electron source 100 includes a housing 112 which acts as the anode of the electron source. The front portion 113 of the housing 112 has an opening 114, for example a slit-opening. Within the housing 112 a cathode 110 is provided. Electrons that are generated in the housing and which are accelerated towards the front portion 113 of the housing 112 can exit the linear electron source 100 through the opening 114.

According to different embodiments, the anode can, for example, be manufactured from a material like copper, aluminum, steel, and mixtures thereof, and the like.

According to embodiments described herein, which can be combined with other embodiments of linear electron sources, the linear electron source can be mounted within a vacuum chamber. Thereby, the region exterior of the housing 112 and, in particular, the region between the opening 114 of the electron source and the target for impingement of the electrons can be evacuated to a pressure of, for example, $10^{-2}$ to $10^{-4}$ mbar. The linear electron source 100 is connected to a gas supply having a gas conduit 130. The flow of gas can be regulated such that the pressure within the housing corresponds to a pressure above $10^{-3}$, typically a pressure above $10^{-2}$ mbar. According to different embodiments described herein, the gas which is inserted in the housing 112 through the gas conduit 130 can be a gas at least from the group consisting of noble gases (e.g., argon), $N_2$, $O_2$, and mixtures thereof.

According to embodiments described herein, which can be combined with other embodiments described herein, the cathode 110 is connected to a power supply by an electrical conduit or conductor 120. The electrical conductor passes through an isolating cathode support member 122. According to yet further embodiments, the isolating cathode support member 122 is also provided in a gas sealing manner such that the pressure difference from the interior of the housing 112 and the exterior of the housing 112 can be maintained. The housing 112 is grounded and acts as an anode. Thereby, the voltage between the cathode 110 and the anode results in generation of a plasma. Electrons generated in the plasma are accelerated towards the anode. Electrons being accelerated towards the front portion 113 can exit the linear electron source 100 through the opening 114.

According to some embodiments, the power supply for providing a voltage to the cathode 110 is adapted for controllably providing a voltage in a range of for example −5 kV to −30 kV, typically in a range of −5 kV to −14 kV. FIG. 1 shows a cross-sectional view wherein the cathode 110 has a rectangular shape and is mounted within the housing 112 such that a separation space at the bottom, at the top and at the left side is provided. These separation spaces, i.e. the separation spaces which do not face the front surface 113 of the linear electron source 100 can be formed to be substantially uniform. Typically, they are sufficiently large to prevent arcing and can for example be in a range of 2 to 12 mm, typically 3 to 8 mm, for example, 4 to 5 mm. According to embodiments described herein, the separation space is chosen to be sufficiently large to prevent arcing and sufficiently small to substantially prevent gas discharge between the cathode and the upper, lower and left (see FIG. 1) walls of the housing 112.

According to different embodiments described herein, which can be applied for the embodiments of linear electron sources described herein, the energy distribution of the emitted linear electron beam can be controlled by the potential of the cathode and the pressure within the housing 112. Thereby, for a relatively thick cathode sheath and a relatively thin plasma region a plurality of different energies can be generated depending on the position of the electron generation in the cathode sheath. Further, the thin plasma region reduces the probability of energy dissipation within the plasma region. Contrary thereto if the thickness of the plasma region is increased there is an increasing likelihood that the electrons generated in the cathode sheath interact with electrons and ions in the plasma region. Thereby, high energy electrons dissipate their energy to other particles, such that a smaller energy distribution can occur. According to embodiments described herein, by adjusting the operation parameters the energy distribution (FWHM) can typically be below 50%, 30% or 10% of the maximum electron energy. For example, values below 1000 eV such as 100 or 10 eV can be generated. It will be apparent for a person of ordinary skill in the art that the above mentioned values for an energy distribution width will also have a minimum value, which is given by a theoretical minimum, and which might be in a range of 0.1 to 1 eV.

Figure 2:
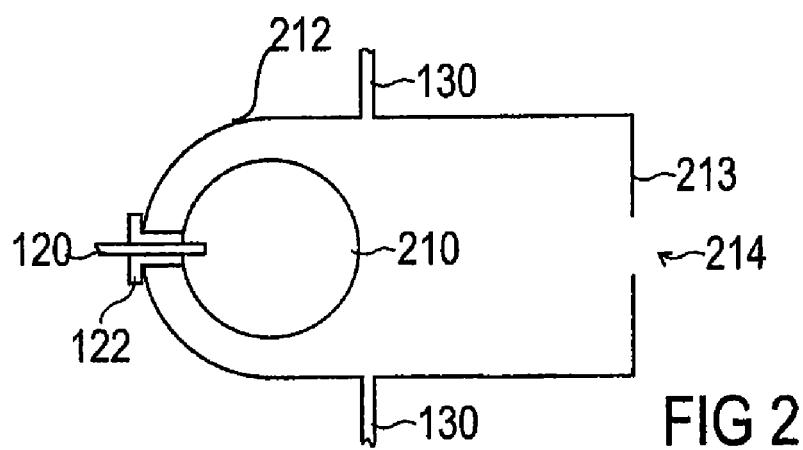
FIG. 2 shows a schematic cross-sectional view of a further linear electron source according to embodiments described herein.

According to yet further embodiments which are discussed with respect to FIG. 2 a linear electron source may also have a cylindrical cathode 210 and a housing 212 which is U-shaped in a cross-sectional view. Thereby, a substantially uniform separation space between the cathode 210 and the anode can be provided. However, since the initial velocity of generated ions, which are generated in the vicinity of the cathode, will be substantially perpendicular to the surface of the cathode, a rectangular cathode can typically be used. Thereby, the initial velocity of the generated electrons is better directed towards the front surface 113 (as compared to 213) and, in particular, the opening 114 (as compared to the opening 214).

A further modification shown in FIG. 2, which can be combined with other embodiments described herein, is that two gas conduits 130 are provided for introducing gas into the housing 212. Thereby, as shown in FIG. 2 a gas like, for example, noble gases (e.g., argon), $N_2$, $O_2$, or the like can be introduced from an upper portion and a lower portion of the housing 212. This can improve the gas uniformity within the housing 212. A more uniform gas distribution in the housing and, in particular in the vicinity of the cathode surface facing the exit slit 214 improves the uniformity of electron generation of the linear electron source 200.

According to some embodiments, which can be combined with other embodiments described herein, the cathode support member 122, which also provides the electrical feedthrough for the high voltage for the cathode, can be provided such that the high voltage connection does not necessarily have to be adapted for isolating the high voltage under a reduced atmospheric pressure.

Figure 3:
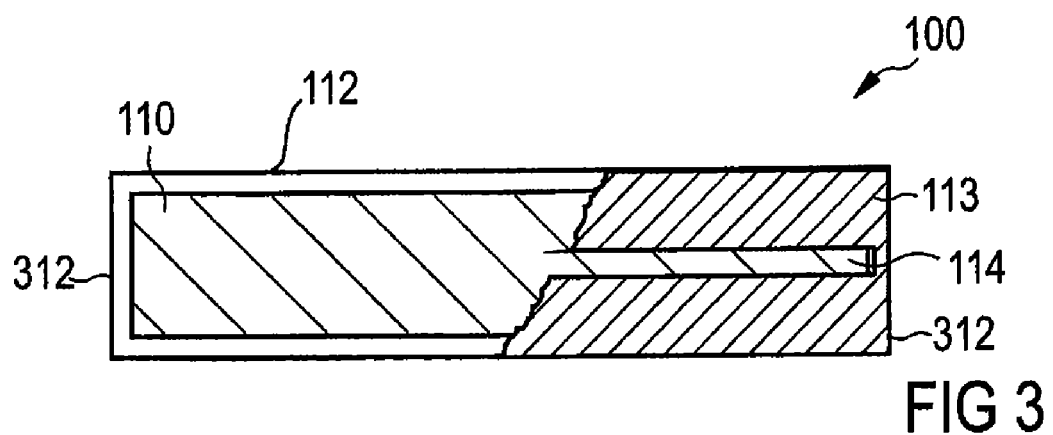
FIG. 3 shows a schematic front view of a linear electron source according to embodiments described herein.

FIG. 3 shows a side view of a linear electron source 100 from the side facing the opening 114. The linear electron source 100 includes a housing 112 acting as an anode, which can typically be grounded, and a cathode 110. The front portion 113 is covered by a cover having a slit shaped opening 114. As shown in FIG. 3, the housing 112 has a sidewall 312 at both ends.

According to embodiments described herein, the linear electron source has a length, i.e. from the left sidewall 312 to the right sidewall 312 of 60 cm, 70 cm, 80 cm or larger. According to typical embodiments, which can be yielded by combination with other embodiments described herein, the length can be at least 70 cm, such as e.g. between 1.5 m to 3 m, for example, 2 m, 2.5 m or 2.8 m. The increased length of the linear electron source enables the use of the linear electron source in manufacturing processes that require a high throughput and use, for example, large area substrates, wide webs, sheets or other targets that require electron bombardment over a wide length.

Thereby, the length of the cathode 110 is also increased. In light of the heating of the cathode during operation, which can be up to a temperature of 300° C. to 500° C. or even 800° C., the cathode 110 having an increased length gets longer in light of the thermal expansion coefficient of the cathode material.

This might be relevant in particular if, according to embodiments described herein, a cooling unit of the cathode and/or the anode is omitted.

As discussed with regard to FIGS. 1 and 2, the cathode 110 and the housing 112 typically has a uniform separation space at those opposing surfaces, which are not facing the slit opening 114. During start up of the operation of the linear electron source 100, the cathode can heat up to several hundred degrees Celsius which results in a significant elongation of the cathode with respect to the length thereof. Thus, the separation space between the cathode and the respective two sidewalls changes during heating up of the cathode.

Accordingly, according to embodiments, which can be combined with other embodiments described herein, the length of the cathode in a cold, i.e. room temperature, state can be such that the separation space between the cathode 110 and the sidewall 312 is a few millimeters larger than it is supposed to be during operation. According to different embodiments, the cathode in a cold state can be about 0.5 mm up to 10 mm too short for the desired separation space preventing glow discharge between the cathode and the housing sidewall being on anode potential.

Having the cathode length in a cold state being shorter or, in other words, the separation space from the side of the cathode to the sidewall of the housing being larger than desired during operation, allows for thermal expansion of the cathode during start-up of the operation.

According to different embodiments, which can be combined with other embodiments described herein, the cathode can include a material selected from the group consisting of: steel, stainless steel, copper, aluminum, graphite, CFC (carbon-fiber-reinforced carbon), composites thereof, or mixtures thereof.

If the cathode is, for example, manufactured from copper, has a length of 2 m and has a fixed cathode support in the middle thereof, i.e., the cathode extends 1 m to the left and 1 m to the right from a fixed support, the elongation based on the thermal expansion coefficient of $17 \cdot 10^{-6}$ l/K can be about 8.5 mm on each side. According to different embodiments, the same geometry manufactured from a stainless steel cathode may have an elongation in a range of 2.5 mm to 7.5 mm depending on the type of stainless steel used. According to yet further embodiments, the same geometry manufactured from a graphite or CFC material cathode, might have an elongation in a range of 0.75 mm to 1.5 mm.

Thus, according to some embodiments, which can be combined with other embodiments described herein, the elongation and, thereby, the additional separation space in a cold status can be reduced for cathode materials like certain stainless steel types, graphite, or CFC.

Figure 4:
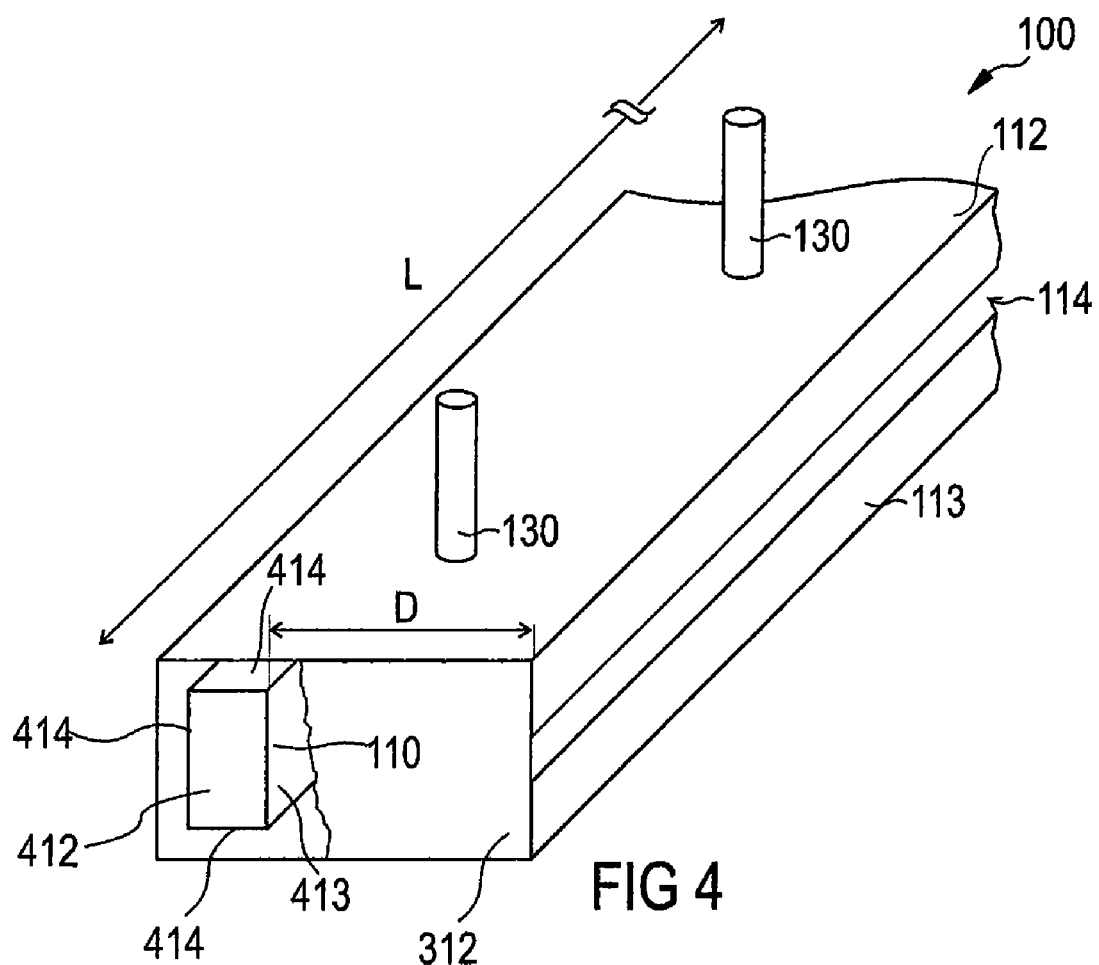
FIG. 4 shows a schematic view of a long linear electron source according to embodiments described herein.

FIG. 4 illustrates further embodiments of a linear electron source. The linear electron source shown in FIG. 4 includes the housing 112, the front portion 113 having the slit opening 114 and the housing sidewall 312, which is only partly shown in order to show the cathode 110 within the housing 112. As described above, for embodiments described herein, the housing 112 can be grounded to act as an anode of the linear electron source. The length L of, for example, 1 m to 3 m, typically 2 m or other values disclosed herein, is indicated by the arrow L. FIG. 4 shows only a portion of the linear electron source. According to embodiments described herein, which can be combined with other embodiments described herein, two or more gas conduits 130 are provided for introducing the gas in the housing 112. According to further embodiments, as illustrated in FIG. 2, the two or more gas conduits 130 can be provided on a top side and a bottom side. According to yet further embodiments, the distance between the individual gas conduits 130 can be in a range of 150 to 300 mm, typically 200 to 250 mm.

According to yet further embodiments, the gas conduits 130 which are connected to a gas tank for providing the desired gas like noble gases (e.g., argon), $N_2$, $O_2$, mixtures thereof, or the like, have a similar length and arrangement. That is, a cascade of gas conduits is provided, wherein the individual components from the gas tank to the gas inlet in the housing is substantially similar for each of the gas conduits 130. This allows for a uniform pressure for each of the gas inlets in the housing and an electron beam generation with improved uniformity.

If for example a gas tank is connected through a gas conduit to a valve and a valve is connected to the portion of the gas conduit 113 shown in FIG. 4, the first portion from the gas tank to the valve and the second portion from the valve to the gas conduit can have a similar length for each of the gas inlets. Thereby, a small deviation in the individual gas conduits might be acceptable. Generally, according to embodiments described herein, one or more of the elements of a gas conduit, a valve, a tank, and the like can be used in a gas supply for supplying a gas like noble gases (e.g. argon) $N_2$, $O_2$, mixtures thereof, or the like into the housing of the source. According to further embodiments, which can be yielded by combinations with other embodiments, at least two gas supplies or even at least 7 gas supplies can be provided. Thereby, the two or more gas supplies may typically share components like the gas tank, gas conduits from the tank to a gas distributor, and/or valves.

As shown in FIG. 4, according to embodiments described herein, the cathode 110 has several sides. The cathode has a front side 413 and an outer side 412. Further, the cathode 110 has an upper side 414, a lower side 414, and a back side 414. The front side 413 has a distance D from the slit opening 114. The sides 414 are spaced from the housing 112 by separation spaces. According to some embodiments, which can be combined with other embodiments described herein, the separations spaces between the sides 414 and the housing 112 are substantially similar and e.g. in the range of 3 mm to 7 mm, e.g., 5 mm.

The sides 412 at each of the ends of the linear electron source have further separation spaces between the side 412 and the side wall 312 of the housing 212. The further separation spaces can, in an operational state, be in the range of 3 mm to 7 mm, e.g., 5 mm, and/or substantially similar to the separation spaces between the sides 414 and the housing 112. However, in light of the elongation of the cathode 110 by heating to a temperature of 300° C. to 500° C. during operation, the further separation space in a non-operational state is between 1 to 10 mm, typically 2 mm, 5 mm or 7 mm larger than in an operations state.

According to yet further embodiments, if for example a differently shaped elongated cathode is considered (see, e.g., FIG. 2) the sides 413 and 414 can be understood as those sides being parallel to the wall of the housing or the slit opening 114.

According to embodiments described herein, the linear electron source has a length L, which is sufficiently long to provide a long linear electron beam for large area substrates, large webs or sheets, or other wide areas for modern fast production apparatuses. The length is typically between 0.7 m and 3 m, e.g. 2 m or 2.5 m. The distance D between the slit opening and the front side 413 of the cathode (along the optical axis or optical plane of the source) is typically in a range of 1 cm to 11 cm, for example, 2 cm to 5 cm. According to embodiments described herein, the length of the linear electron source is at least 5 times or even at least 10 times the distance D from the front cathode side 413 to the opening 114.

Figure 5:
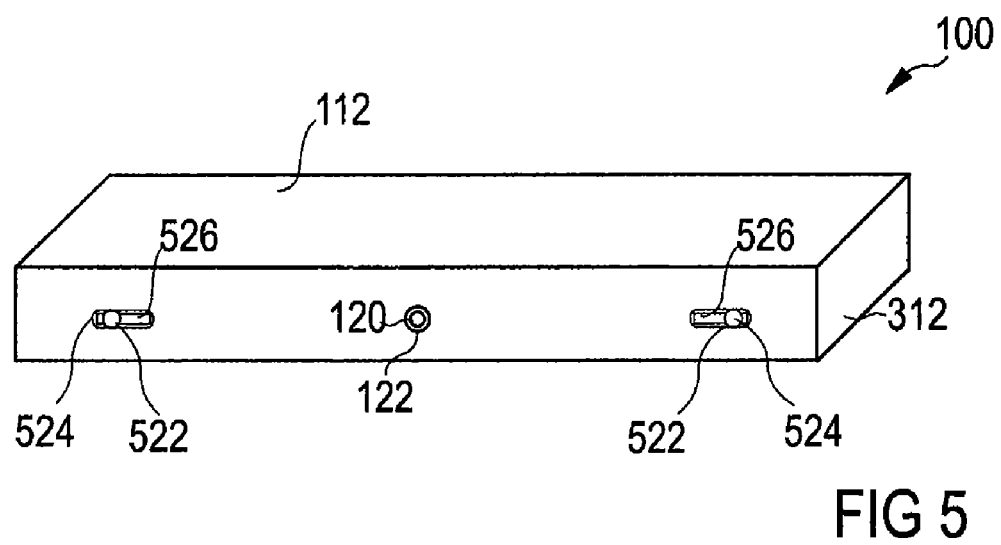
FIG. 5 shows a schematic view of a linear electron source with cathode support structures according to embodiments described herein.

FIG. 5 illustrates further embodiments, which can be combined with other embodiments described herein. A linear electron source shown in FIG. 5 includes the housing 112 having the sidewall 312. FIG. 5 shows a perspective view from the backside, i.e. the side opposing the slit opening. At the backside of the housing 112 different types of support members for supporting the cathode are shown. According to embodiments described herein, it is possible that a linear electron source has one fixed cathode support member and one or more floating support members.

FIG. 5 shows a centre cathode support member 122 with a feedthrough through which the electrical conduit or conductor 120 for providing the high voltage to cathode can be fed. At both ends of the back surface of the housing a slit opening 524 is provided. A floating support member 522, which is fixed to the cathode for supporting the cathode, can slide within the slit opening 524. Additionally a sealing member 526 is shown. The sealing member 526 seals the slit opening 524 such that the pressure difference from the interior of the housing 112 and the exterior of the housing 112 can be maintained as desired.

According to different embodiments, which can be combined with other embodiments described herein, one fixed support member and two or more floating support members can be provided. According to further embodiments, more than one fixed support member and more than two support members, for example four floating support members can be provided.

According to embodiments described herein, which can be combined with other embodiments described herein, the length of the slit opening 524 can be in a range of 0.5 to 10 mm. The length of a slit opening 524 depends on the length of the cathode and the cathode material. As described above, the thermal extension coefficient may very significantly depending on the cathode material utilized. For example, if a cathode having a length of 2 m is provided and the cathode is fixedly supported in the middle of the cathode, a thermal expansion corresponding to 1 m may occur on each side. If copper is used as a cathode material and the cathode heats up by a temperature difference of 500° C., the slit opening 524 may have a length of 7 to 10 mm, for example 8.5 mm. For stainless steel cathodes, the length of the slit opening 524 may for example be in a range of 3 mm to 8 mm. This value may also depend on the type of stainless steel utilized. If graphite or CFC is used and a cathode material, the length of the slit opening 524 may be reduced to about 0.5 to 2 mm.

Further modifications, which may alternatively or additionally be provided for embodiments of a linear electron source, are shown in FIGS. 6 and 7. Therein, the cathode is supported by support members 622. These support members are provided between a lower and a upper surface of the housing 112. According to different embodiments, the support members 622 can be manufactured from an isolation material which does not influence the plasma generation between the cathode 110 and the anode. According to yet further embodiments, it is for example possible, that two, three, four or more support members are provided on the upper and lower side of the cathode, respectively.

As shown in FIG. 7, the support members 622 can be floating support members, which can slide in slit opening 724. In the event of the slit opening 724 trespassing through the wall of the housing 112, a seal might additionally be provided. Alternatively, the slit opening 724 may be a recess in the inner portion of the housing such that no seal is required. According to yet further embodiments, alternatively or additionally fixed support members without a floating ability can be provided for a lower and upper support member 622.

According to some embodiments, which can be combined with other embodiments described herein, the gas supply having the gas conduit 630 may additionally have a gas distribution space 631. Thereby, the gas is provided through the gas conduit 630 in the gas distribution space 631 and small openings or a small slit is provided between the gas distribution space 631 and the interior of the housing 112.

According to some embodiments, the inlet for supplying the gas in the housing 112 can be openings 632 with a diameter of 0.5 to 1.5 mm having a distance in the direction of the length of the linear electron source of 5 mm to 10 mm. The gas distribution area 631 or gas distribution space provides a uniform gas distribution along the length of the linear electron source, such that a similar pressure is provided at each of the openings 632. According to some embodiments, as shown in FIG. 6, the openings acting as an inlet for the gas in the housing 112 are provided offset from the gas conduit 630. This might prevent a direct gas flow from the conduit through the openings, whereby the effect of the gas distribution area or space 631 might be improved.

As mentioned above, the individual gas conduits 630 which might be provided along the length of the linear electron source with a distance of 200 to 300 mm or even 500 mm (in the case of a gas distribution area 631) are arranged such that a cascade gas supply module is provided. Thereby, each of the gas conduits, valves, and the like have similar lengths from the gas tank up to the gas distribution area 631.

FIG. 8 is a cross-sectional view of a linear electron source. Thereby, the cross section is taken at a position without the electrical conduit 120 and at a position without an opening 632 (see FIG. 6). According to some embodiments, which can be combined with other embodiments described herein, the cathode 810 may have a core 814 and an outer layer 812. Thereby, for example the core or main body 814 can be of a material like stainless steel, copper, aluminum or mixtures thereof. The outer layer 812 can be, for example, of a material like graphite or CFC. Providing an outer layer of CFC might reduce the sputtering or removal of cathode material that might occur in light of ions impinging on the cathode.

A similar effect might be realized by a cathode 910, which is shown in FIG. 9. Thereby, a body 914 is provided and a front plate 912 is provided at the body. According to some embodiments, it is possible that the main body 914 includes a material like stainless steel, aluminum, copper and mixtures thereof. The front plate might include a material like graphite or CFC. Thereby, sputtering or removal of cathode material on impingent of ions on the cathode can be reduced.

Figure 10:
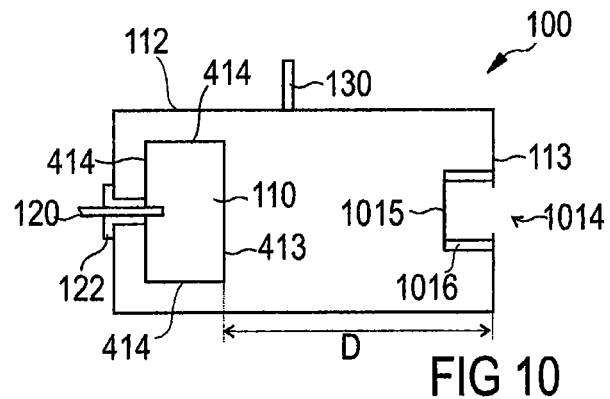
FIG. 10 shows a schematic view of a linear electron source with a modified exit slit according to embodiments described herein.
Figure 11:
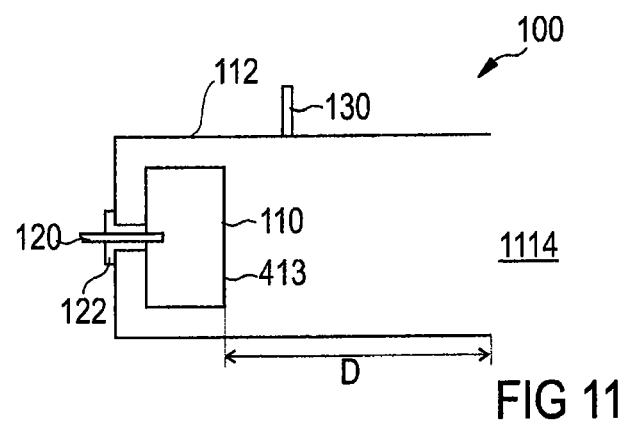
FIG. 11 shows a schematic view of a linear electron source with a wide electron exit according to embodiments described herein.

Modifications of the slit opening providing a window for exit of the generated electrons are illustrated in FIGS. 10 and 11. According to different embodiments, which can be combined with other embodiments described herein, the opening 1014 may have an electron emission grid 1015, which is mounted in a recess. Thereby, a grid mounting frame 1016 can be used for mounting the electron emission grid inside the housing 112. Thereby, according to some embodiments, the distance between the emission grid being on ground potential and the front portion or surface 113 being on ground potential can be adjusted such that the distance between the cathode and the emission grid 1015 is smaller than the distance between a cathode 110 and the front surface 113. Accordingly, the electrical field strength might be provided such that a higher electrical field strength is provided in the vicinity of the emission grid. According to some embodiments, the electron emission grid 1015 might be a mash of a material like tungsten or the like. Thereby, a high transparency for having electron trespassing there through can be provided.

As shown in FIG. 10, according to embodiments described herein, the cathode 110 has several sides. The cathode has a front side 413. Another side, which has been described with respect to FIG. 4, is not shown in the cross-sectional view of FIG. 10. Further, the cathode 110 has an upper side 414, a lower side 414, and a back side 414. The front side 413 has a distance D from the slit opening 1014, that is the opening in the front wall 113 of the housing 112. The sides 414 are spaced from the housing 112 by separation spaces. According to some embodiments, which can be combined with other embodiments described herein, the separation spaces between the sides 414 and the housing 112 are substantially similar and e.g. in the range of 3 mm to 7 mm, e.g., 5 mm.

According to yet further embodiments, if for example a differently shape elongated cathode is considered (see, e.g., FIG. 2) the sides 413 and 414 can be understood as those sides being parallel to the wall of the housing or the slit opening 114.

According to embodiments described herein, the linear electron source has a length, which is sufficiently long to provide a long linear electron beam for large area substrates, large webs or sheets, or other wide areas for modern fast production apparatuses. The length is typically between 0.7 m and 3 m, e.g. 2 m or 2.5 m. The distance D between the slit opening and the front side 413 of the cathode (along the optical axis or optical plane of the source) is typically in a range of 1 cm to 11 cm, for example 2 cm to 5 cm. According to embodiments described herein, the length of the linear electron source is at least 5 times or even at least 10 times the distance D from the front cathode side 413 to the opening 114.

The corresponding dimensions can also be seen in FIG. 11. As shown in FIG. 11, the front surface (see, e.g. 113 in FIG.

10) can be omitted. Thereby, the opening 1114 can be enlarged such that more electrons may leave the linear electron source. Accordingly, the distance D between the front side of the cathode 110 and the opening 1114 can be defined as the distance between the cathode surface and the end of the housing 112, which defines the enlarged opening 1114.

In light of the enlarged opening 1114, the intensity of the emitted electron beam can be increased. This might, for example be utilized if the vertical width of the electron beam does not need to be adjusted by a slit opening.

Figure 12:
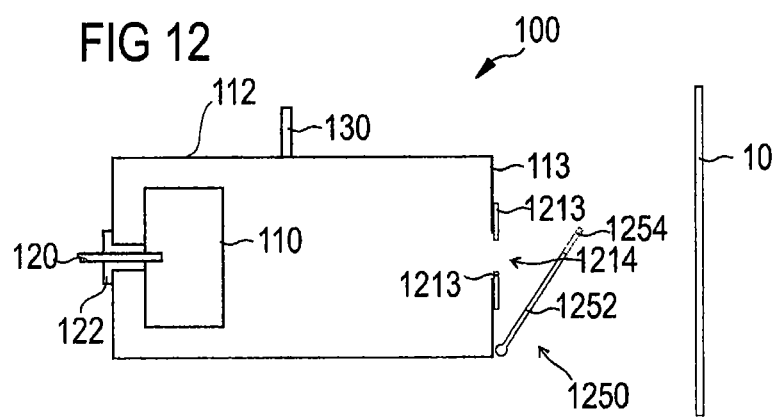
FIG. 12 shows a schematic view of a linear electron source having an exit slit adjusting means and a shutter according to embodiments described herein.

On the other hand, as shown in FIG. 12, adjusting plates 1213 can be provided along the opening 1214. The adjusting plates 1213 provide an adjustable slit opening 1214. Thereby, the plates 1213 can be mounted for sliding movement towards and away from one another.

According to yet further embodiments, which can be combined with other embodiments described herein, a shutter 1250 can be provided for closing the slit opening 1214 such that no electrons can impinge on the target 10. For example, the shutter can be rotatable mounted at a lower portion of the linear electron source. If the shutter 1250 is rotated upwardly, the opening 1214 is closed. If the shutter 1250 is lowered, the electron beam generated inside the chamber 112 can impinge on the target 10.

FIG. 12 shows a shutter 1250 having two portions. A centre portion covering the majority of the slit 1214 (insert 1252 as the centre portion) and an edge portion 1254. The edge portion 1254 is slightly longer than the centre portion 1252. Thereby, the edge portion 1254 covers the outer 1 to 3 cm of the linear electron source. Thereby, the slit opening 1214 can be opened in a centre region of the linear electron source and the outer 1 to 3 cm of the slit opening can still be covered. Thereby, a centre portion of the electron beam can pass towards the target, whereas the outer portion of the electron beam, which might, for example, not be completely uniform, can be blocked.

According to embodiments described herein, it is desirable to have a uniformity of the electron emission intensity along the length of the linear electron source of ±10% or lower or ±5% or lower. Thus, it might be desirable to block edge portions of the electron beam and/or to take appropriate measures for improving the uniformity of the gas pressure in the housing as described above.

Figure 13A:
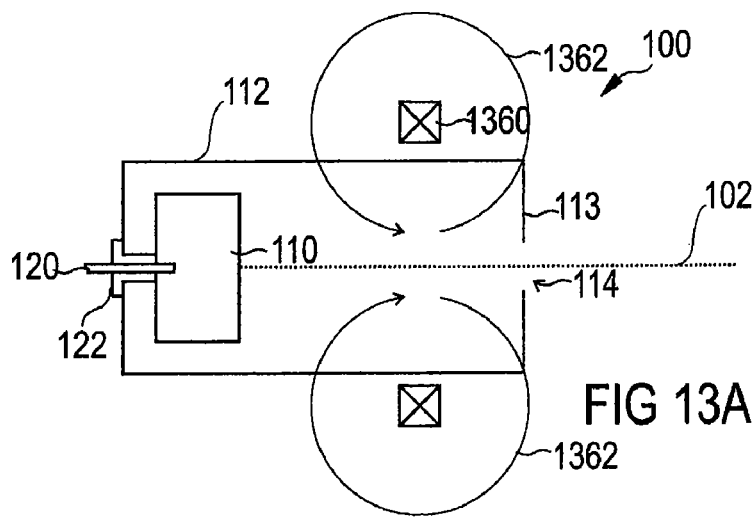
FIGS. 13a and 13b show schematic views of a linear electron source having focusing means for the linear electron beam according to embodiments described herein.
Figure 13B:
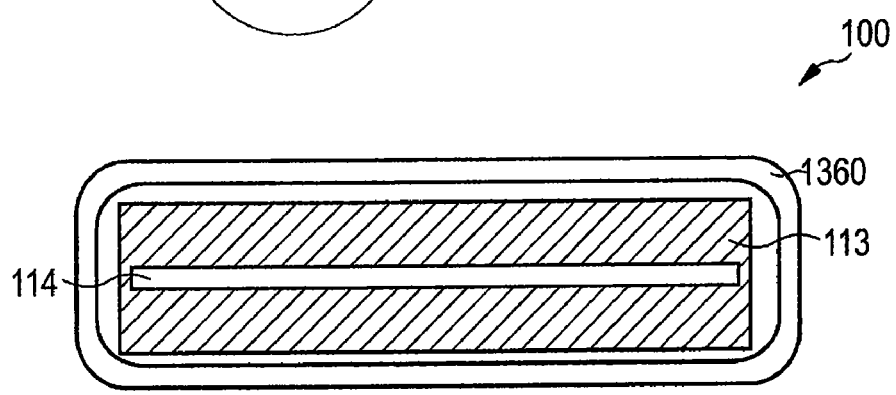

According to yet further embodiments, which can be combined with other embodiments described herein, the linear electron beam can be focused by a magnetic or electrostatic field. Thereby, the focusing should be conducted in the form of a cylinder lens. FIGS. 13a and 13b show a linear electron source 100 and a coil 1360 provided around the housing 112 of the linear electron source. The coil 1360 provides a magnetic field as indicated by arrows 1362. Thereby, a focusing of the linear electron beam towards a horizontal centre axis or an optical axis 102 can be provided. The magnetic field from the coil 1360 may, according to some embodiments, additionally be guided by pole pieces. Generally, the magnetic field 1362 results in a trajectory of the electron beam, which is rotating around an optical axis 102. This rotating trajectory is focused towards the optical axis 102, similarly as a magnetic lens in an electron microscope. Even though, as shown in FIG. 13b, the coil 1360 is not rotational symmetric, a focusing property can be obtained at each position along the length of the linear electron source.

Figure 14:
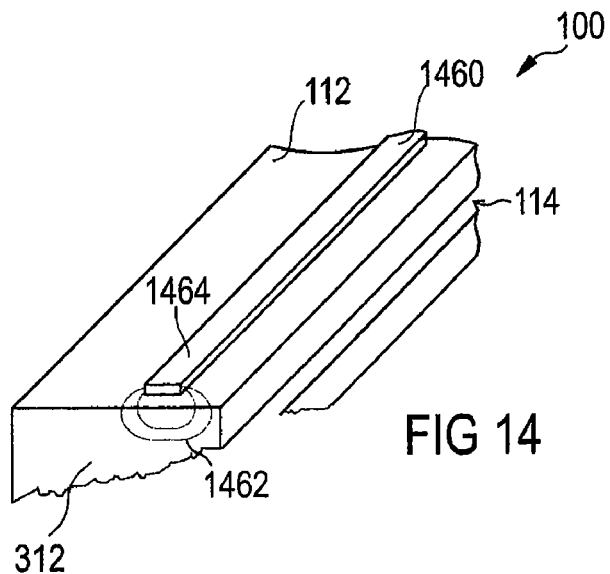
FIG. 14 shows a schematic view of a linear electron source having focusing elements for a linear electron beam according to embodiments described herein.

According to yet further embodiments, a simile magnetic field 1462 can be provided by a pair of permanent magnets 1460, which are illustrated in FIG. 14. The magnets 1460 extends along the length of the linear electron source. The dash line 1464 is provided for illustrating purposes and separates the north pole from the south pole of the permanent magnet.

According to yet further embodiments, electrostatic upper and lower electrodes might be provided in the housing wall or inside the housing for providing a cylindrical length.

Figure 15:
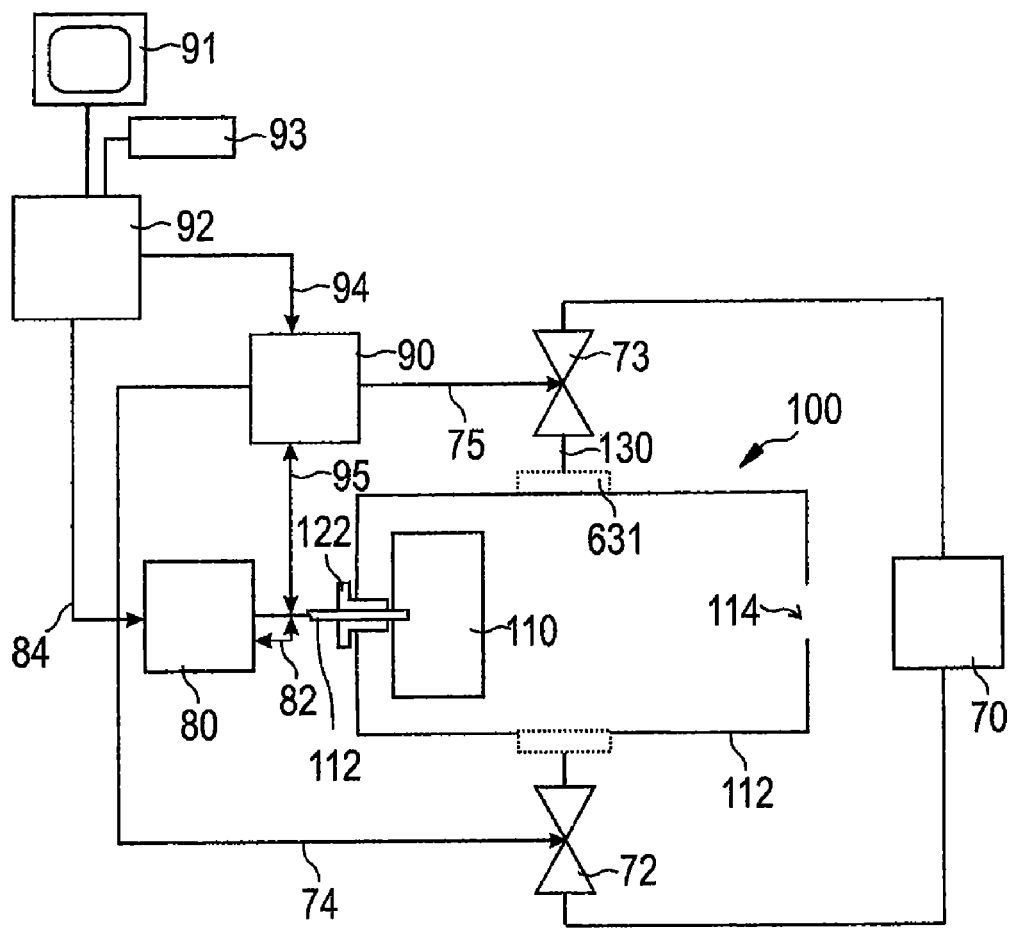
FIG. 15 shows a schematic view of a system for controlling a linear electron source according to embodiments described herein.

Embodiments of a linear electron source 100 having control means for control of the operational parameters are shown in FIG. 15. The linear electron source 100 has a cathode 110, and an anode provided by the housing 112 having a slit opening 114 provided in the front face of the linear electron source 100. A high voltage can be provided to the cathode by the electrical connection 120. The housing is grounded to provide the anode on a ground potential. A gas like noble gases (e.g., argon), $N_2$, $O_2$, mixtures thereof or the like is provided from the gas tank 70 through valves 72, 73, gas conduits 130, and gas distribution spaces 631 into the housing 112 for generating a plasma. Generally, according to some embodiments described herein, one or more of the elements of a gas conduit, a valve, a gas tank, a gas distribution space, and the like can be used in a gas supply for supplying a gas like noble gases (e.g., argon) $N_2$, $O_2$, mixtures thereof or the like into the housing of the source. According to further embodiments, which can be yielded by combinations with other embodiments, at least two gas supplies or even at least 7 gas supplies can be provided. Thereby, the two or more gas supplies may typically share components like the gas tank, gas conduits from the tank to a gas distributor, and/or valves.

According to some embodiments described herein, as illustrated in FIG. 15 the gas conduit 130 providing the gas to the upper gas distribution space 631 has a similar length as the gas conduit 130 providing a gas to the lower gas distribution area 631. Thereby a uniform gas pressure in the housing can be generated. The same applies for different gas inlets provided at the upper, and/or lower portion of the housing along the length of the linear electron source 100.

Within each of the gas conduits 130 valves 72 and 73, respectively are provided for controlling the gas flow in the plasma region. The valves are controlled by controller 90 as indicated by arrows 74 and 75, respectively. According to some embodiments described herein, which can be combined with other embodiments described herein, the valves 72 and 73, respectively can be controlled with a reaction time in a range of 1 to 10 msec. Thereby, for example in the case of arcing occurring between the cathode and the anode a fast reaction can be realized.

Generally, the current and thereby the electron beam intensity, can be controlled by the amount of gas provided in the plasma region. The current provided to the linear electron source is proportional to the current provided by the emission of electrons. For example, if the current should be reduced the valves 72 and 73 are controlled such that the amount of gas in the plasma region is increased.

The high voltage for a cathode 110 is provided by the power supply 80. According to some embodiments, the controller 90 measures the current provided from the constant voltage source 80 to the cathode. This is indicated by arrow 95 in FIG. 15. Further, as indicated by arrow 82 the voltage supply 80 can include an arcing rejection control. If arcing occurs between the cathode and the anode the current might show a rapid increase which can be detected by the arcing rejection means of the power supply 80. According to some embodiments, which can be combined with other embodiments described herein, the voltage supply is adapted for switching off and on in a millisecond range, for example 1 millisec to 10 msec. Generally, the reaction time might dependent on the velocity a substrate being moved along the electron source. Thus, for very fast moving substrates, the reaction time might even be faster or can be lower if the substrate is not moved or only slowly moved. Thereby, if arcing occurs, the power supply 80 can be immediately switched of and further switched on again immediately after the arcing disappears. On the one hand, this allows for stable operation of the linear electron source. On the other hand, the operation can be quasi-continuous. This is in particular relevant if the linear electron source is used for applications for which a target is a fast moving web, foil and the like.

A main control unit 92, which may have a display means 91 and an input means 93 like a keyboard, a mouse, a touch screen, or the like provides desired values for the current and the voltage. The desired current, i.e. the electron beam intensity is provided to the controller as indicated by arrow 94. The controller measures the present current and adjusts the gas flow in the event the present current is not equal to the desired current. The main control unit 92 further gives a desired value for a voltage to the power supply 80 as indicated by arrow 84 in FIG. 15. The voltage provided between the cathode and the anode can be used to influence the energy of the emitted electrons. Thereby, the power supply 80 sets the cathode 110 on a constant potential in a range of −3 to −30, typically −5 to −10 kV, for example −10 kV. Since the anode is grounded, a constant voltage between the cathode and the anode is applied.

In the following embodiments, methods using linear electron sources and apparatuses in which linear electron sources are integrated will be discussed with respect to FIG. 16 to 21. Thereby, according to some embodiments, a linear electron source as described above can be used. Further linear electron sources with a length of for example 20 to 60 cm can be used. Generally, the linear electron sources have a cathode to which a high voltage is provided by an electrical connection and an anode, which is provided by the housing of the linear electron source.

Generally, according to embodiments described herein, the emitted electron beam has a uniformity along the length of the linear electron source with a deviation of ±10% or lower or ±5% or lower. Further, for different applications, the energy of the electrons in the linear electron beam can be adapted for different applications and the intensity of the linear electron beam can be adapted for different applications.

Figure 16:
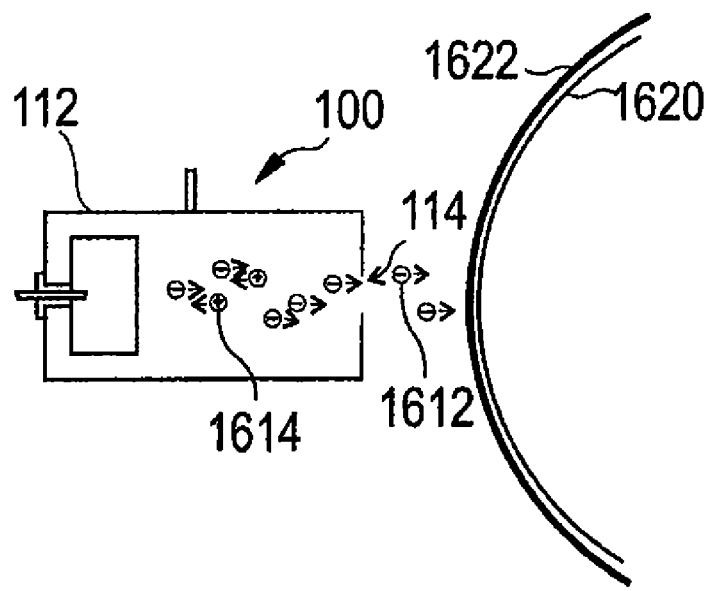
FIG. 16 shows a schematic view illustrating a method using a linear electron source according to embodiments described herein.

According to some embodiments, a linear electron source and, in particular, a linear electron source according to embodiments described above can be used for charging a foil or a web. According to embodiments described herein, in particular thick foils or web with a thickness of 5 to 100 µm, typically 10 µm or 25 µm can be charged with a linear electron source. As shown in FIG. 16, a foil 1622 is guided over a roller 1620. Such guiding or transport of a foil 1622 over a roller 1620 can be used in a plurality of apparatuses for manufacturing webs or foils, for deposition material on webs or foils, for patterning thin-film layers on webs or foils, or the like. Thereby, a charge should be provided to the foil for a plurality of reasons. On the one hand, the roller 1620 can be charged to a positive potential and a foil or the like can be negatively charged to improve the adhesion of the foil to the roller. On the other hand, the foil may be charged by different processes and the charge on the foil should be removed.

In particular for thick foils above, for example 10 µm, a surface charge on the foil may often not lead to the desirable result. According to embodiments described herein, the linear electron source 100 can be used for implantation of electrons into the foil. Thereby, an implantation depth of several µm, for example 2 µm to 10 µm can be realized depending on the energy of the electrons 1612 emitted by the linear electron source 100.

According to some embodiments, which can be combined with other embodiments described herein, the implantation depth can be adjusted to be at least 20% of the foil thickness and/or between 50% and 80% of the foil thickness. Thereby the charge can be located close to the counter electrode without having significant portions of the charged passing through the foil and impinging on the counter electrode.

According to different embodiments, for providing the desired implantation depth a voltage in a range of −5 to −10 kV or even up to −20 kV, e.g., −15 kV, can be applied to the cathode of the linear electron source 100. Within the linear electron source electrons 1612 and ions 1614 are generated. In light of the voltage between the cathode and the anode, the electrons are accelerated towards the front surface of the linear electron source and can exit the linear electron source through the opening 114 for impingement on the foil 1622.

For electron implantation purposes, generally a slit width of the opening 114 can be provided in a range from 1 mm to 10 mm. Thereby, the emitted current can be limited to be in a range from 10% to 30% of the current provided by the power supply. According to embodiments described herein, which can be combined with other embodiments described herein, the implantation depth is chosen depending on the thickness of the foil i.e. the implantation depth should be smaller than the thickness of the foil.

According to embodiments described herein, the reaction time of the control and the valves for gas insertion and the reaction time for arc reaction of the power supply can be in the range of a view milliseconds, typically 1 millisec to 20 msec. Thereby, for a high speed transportation of a foil 1622 over a roller 1620 an almost continuous charge implantation can be provided even in the case arcing occurs between the cathode and the anode.

According to other embodiments, which can be combined with embodiments described herein, methods of electron implantation, methods of heating, or methods of cleaning can provide a distance from the opening 114 or 1714 (see FIG. 17) from the target for electron bombardment below 50 mm. Thereby, the loss of scattering of electrons with molecules being present between the slit opening and the target can be reduced. According to some embodiments, the scattering rate can be adapted to have at least 80% or 90% of the electrons emitted from the opening impinging on the target.

Figure 17:
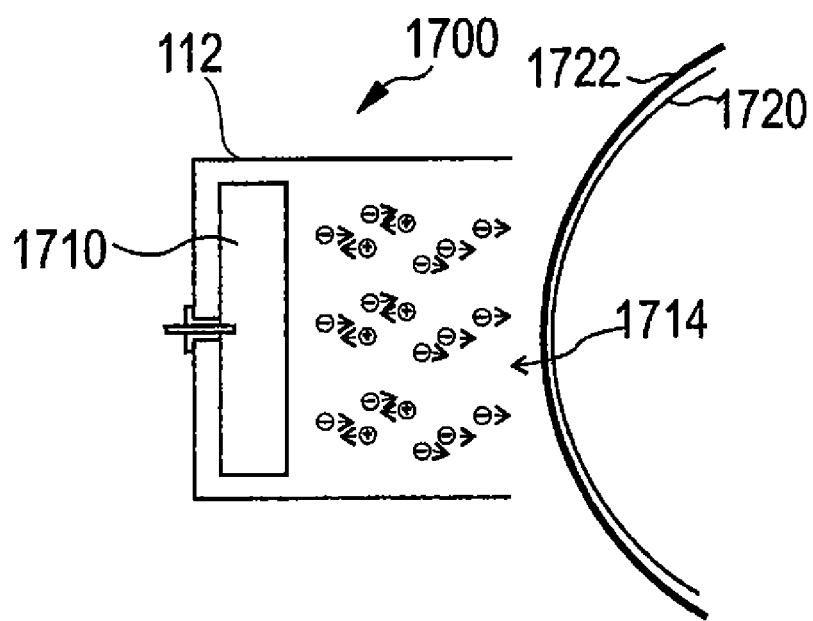
FIG. 17 shows a schematic view illustrating methods for using a linear electron source according to embodiments described herein.

According to yet further embodiments, as shown in FIG. 17, methods of electron implantation, methods of heating, or methods of cleaning can provide an opening 1714 having a height, which corresponds to at least 50%, at least 80%, at least 90% or even substantially 100% of the height of the housing. Thereby, the height is defined in a plane perpendicular to the length of the electron source. The length of the electron source can be defined as extending in the direction of the slit opening 114 or 1714. Accordingly, for example, in FIGS. 16 and 17 the height of the opening is the vertical dimension of the opening.

Thereby, according to yet other embodiments, it is additionally possible that the distance between the opening 114 or 1714 from the target for electron bombardment is below 5 mm. Thereby, essentially all electrons, which do not hit the anode, will be guided on the target.

A further method using a linear electron source in general or linear electron sources as described herein can be the heating and/or cleaning of metal foils. Metal foils are, for example used for the manufacturing of photovoltaic thin films. During manufacturing of thin-film solar cells or other films for which metal foils are used, the metal foil needs to be preheated for various processing steps.

FIG. 17 shows a linear electron source 1700, which is positioned in front of a metal foil 1722 guided over a roller 1720.

According to some embodiments, which can be combined with other embodiments described herein, the cathode 1710 of the linear electron source 1700 can be increased in size. Thereby, the surface of the cathode can have an area in a range of 50 to 6000 cm$^2$. For example, the height of the cathode, i.e. the vertical direction in FIG. 17, can be in a range of 1 cm to 30 cm. For increased sizes, the height can, in particular, be in a range of 15 cm to 30 cm, for example, 15 cm or 20 cm.

For heating methods, generally the intensity of the emitted linear electron beam should be increased. The enlarged cathode surface results in increased electron beam intensity, that is, in an increased electron beam current. Further, the opening 1714 of the linear electron source 1700 is provided to be at least 80 or 90% of the height of the housing. Typically, a front surface for providing a slit opening can be omitted. Thereby, the electron beam current can be further increased.

According to yet further embodiments, which can be combined with other embodiments described herein, the distance from the linear electron source 1700 to the foil 1722 can be reduced to be below 50 mm. Thereby all electrons being emitted from the wide opening can impinge on the foil.

According to embodiments described herein, the efficiency of providing power into intensity on a metal foil can be improved by increasing the front surface of the cathode 1710, by providing a wide opening 1714, which may substantially correspond to the dimensions of the housing of the linear electron source and/or by reducing the distance of the linear electron source 1700 to the target.

According to embodiments described herein, for heating and/or cleaning of a metal foil the wide electron beam opening can provide an efficiency of up to 80%. Typical voltages between the cathode and the anode can be in a range of 5 to 10 kV. Further it is also possible to provide higher voltages in a range of 12 to 15 kV, for example 13 kV.

According to yet further embodiments, the methods of heating a metal foil can also be used for cleaning of a metal foil. Thereby, disposals of oil or other materials which adhere to the metal foil can be evaporated by heating the metal foil. Further, complex chemical components, for example, oils can be cracked by the energy provided with the electron beam. The crack remainders of the oil and the like can then be removed by evaporation. According to yet other embodiments, linear electron sources in general and linear electron sources according to embodiments described herein can be used for removal of oil from a web foil. Capacitors, for example can be produced on a web foil by providing a pattern of oil on the foil and depositing metal films in the region which is not covered by oil. Thereby, after the metal deposition process, the oil needs to be removed and even small remainders of oil on the web may deteriorate the operation of the capacitors to be manufactured. Thus, it is desirable, to have a fast process to remove oil from a web even if the web velocity is high during the manufacturing process. According to embodiments described herein, the oil from a web can be removed by a method described with regard to FIG. 17.

FIG. 17 shows a linear electron source 1700, which is positioned in front of a metal foil 1722 guided over a roller 1720.

According to some embodiments, which can be combined with other embodiments described herein, the cathode 1710 of the linear electron source 1700 can be increased in size. Thereby, the surface of the cathode can have an area in a range of 50 to 6000 cm$^2$. For example, the height of the cathode, i.e. the vertical direction in FIG. 17, can be in a range of 1 cm to 30 cm. For increased sizes, the height can, in particular, be in a range of 15 cm to 30 cm, for example, 15 cm or 20 cm.

For cleaning or heating methods, generally the intensity of the emitted linear electron beam should be increased. The enlarged cathode surface results in increased electron beam intensity that is the electron beam current. Further, the opening 1714 of the linear electron source 1700 is provided to be at least 80% or 90% of the height of the housing. Typically, a front surface for providing a slit opening can be omitted. Thereby, the electron beam current can be further increased.

According to yet further embodiments, which can be combined with other embodiments described herein, the distance from the linear electron source 1700 to the foil 1722 can be reduced to be below 50 mm. Thereby all electrons being emitted from the wide opening can impinge on the foil.

According to embodiments described herein, the efficiency of providing power into intensity on a metal foil can be improved by increasing the front surface of the cathode 1710, by providing a wide opening 1714, which may substantially correspond to the dimensions of the housing of the linear electron source and/or by reducing the distance of the linear electron source 1700 to the target.

According to embodiments described herein, for heating and/or cleaning of a metal foil the wide electron beam opening can provide an efficiency of up to 80%. Typical voltages between the cathode and the anode can be in a range of 5 to 10 kV. Further it is also possible to provide higher voltages in a range of 12 to 15 kV, for example 13 kV.

According to embodiments described herein, a linear electron source in general and, in particular, linear electron sources as described herein can be used for an evaporation apparatus.

For thin-film coating of a material on a substrate, an appropriator can be used. For example, coatings with metal films, which provide a capacitor of a large penal display or a protective layer on a flexible structure or web can be applied with evaporators. Generally, there is a tendency, in particular for large penal displays that the substrate size increases and the coating processes need to be improved.

FIG. 18 shows an evaporator having a linear electron source 100 arranged below an evaporation crucible 180. The linear electron source 100 has a housing 112 with a side wall 312 and a slit opening 114. A slit opening 114 faces the lower portion of the evaporation crucible 180. According to embodiments described herein, during operation of the linear electron source the electron beam impinges on the lower side of the evaporation crucible 180 and thereby heats the evaporation crucible. If a material like, for example, aluminum is to be evaporated in a crucible, the aluminum may be fed in a melting area of the evaporation crucible in a recess portion 182. Further, the aluminum is heated such that it is evaporated and can be deposited on a substrate or the like.

A further embodiment of an evaporator is shown in FIG. 19. Thereby, a plurality of evaporation crucibles 980 is positioned above the slit opening 114 of the linear electron source 100. Typically, the evaporation crucibles 980 can be arranged with respect to each other such that there is no gap between the evaporation crucibles. As described above, a material to be evaporated can be fed into each of the evaporation crucibles having a recess portion and the crucibles are heated to evaporate the material like aluminum, or the like.

Further details of embodiments, which can be combined with other embodiments described herein, are shown in FIG. 20. FIG. 20 shows a linear electron source 100 having a cathode 110 and a housing 112 acting as the anode. The cathode 110 is connected to a high voltage source by an electrical connector 120 which is provided through a cathode support member 122. A gas like noble gases (e.g., argon), $N_2$, $O_2$, mixtures thereof or the like can be inserted via a gas conduit 130. During operation of the linear electron source 100 electrons are accelerated toward the target in the form of an evaporation crucible 2080. Thereby, the evaporation crucible is heated such that material to be deposited on a substrate is melted and evaporated. According to different embodiments described herein, which can be combined with other embodiments described herein, the temperature of the crucible can be in a range of 1000° C. to 1600° C., depending on the material to be evaporated. The evaporation crucible 2080 can have a recess portion 2084 for receiving the melted material. As indicated by wire 2082 the material can, for example, be continuously fed to the evaporation crucible by a wire.

According to different embodiments, which can be combined with other embodiments described herein, the material for manufacturing the evaporation crucible 2080 can typically be selected from the group consisting of a metallic boride, a metallic nitride, a metallic carbide, a non-metallic boride, a non-metallic nitride, a non-metallic carbide, nitrides, borides, graphite, $TiB_2$, BN, $B_4C$, SiC and combinations thereof. Further, in particular materials like $Al_2O_3$ or ceramic materials can be used. According to further embodiments, the compositions described above can be chosen such that the evaporation crucible 2080 has an electrical conductivity corresponding to a resistance of 2000 μΩ·cm and above or of 300 μΩ·cm or below. Generally, the resistances for crucibles provided herein refer to the resistance in a cold state. Since the evaporation crucible is not heated by a current fed there through, the choice of material for the evaporation crucible is significantly increased and the materials can be chosen independent of the electric properties of the crucible.

According to further embodiments, the evaporation crucible 2080 is located on thermal isolating members 2086. These support members do not need to be of an electrical conductor. Thus, the choice of material can be adapted for a thermal isolation. According to different embodiments, materials like high-temperature metals, high temperature ceramics, or the like can be used. Further, the cross-section area at which the crucible is in contact with the support member can be reduced to 2 $mm^2$ to 10 $mm^2$ according to some further embodiments. Thereby, the support member for the evaporation crucible 2080 results in a reduced heat capacitance of the combination of the crucible and the support thereof. The reduced heat capacitance results in the necessity for reduced energy transfer to the crucible in order to provide the desired temperatures. For example, the crucible support can have a thermal conductivity of 100 (W/m·K) or lower, or even 10 (W/m·K) or lower.

According to yet further embodiments, which can be combined with other embodiments described herein, a plasma electron source in general and, in particular, the linear electron source according to embodiments described herein can be used for heating of a silicon wafer. There is a plurality of processes during semiconductor manufacturing for which silicon wafers need to be heated. These can be deposition processes, annealing processes or other processes for which an elevated wafer temperature should be used. Many semiconductor processing apparatuses use electromagnetic radiation, for example in the form of infrared radiation for heating of a silicon wafer. However, these heating processes suffer from the absorption of infrared radiation in the silicon material. Further, many radiation sources have a relatively wide emission angle. Thus, a lot of energy does not reach the area of the silicon wafer to be heated.

Figure 21:
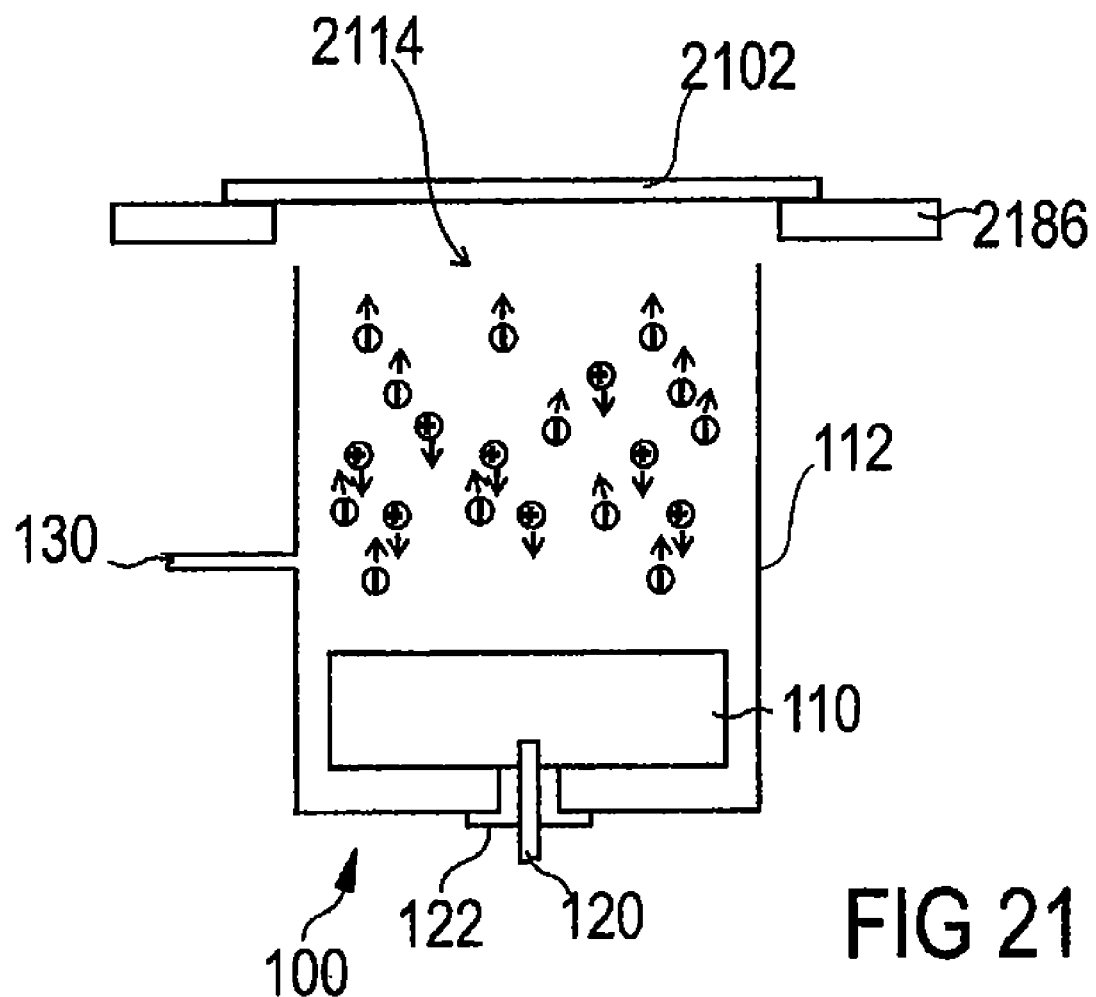
FIG. 21 shows a schematic view illustrating embodiments for heating a silicon wafer and using a linear electron source according to embodiments described herein.

As shown in FIG. 21 a plasma electron source 100 can be arranged such that a surface of a silicon wafer 2102 is eradiated by an electron beam. The plasma electron source includes a cathode 110 to which a high voltage is applied through an electrical conduit 120. The housing 112 acts as an anode and, for example, can be grounded. Gases like noble gases (e.g., argon), $N_2$, $O_2$, mixtures thereof or the like are inserted through gas conduit 130 to provide a uniform gas pressure in the area of the cathode 110. Due to the voltage between the cathode 110 and the anode provided by the housing 112 a plasma is generated. Thereby, electrons are generated.

According to embodiments described herein, the silicon wafer 2102 is located on a support 2186 such that one surface of the wafer can be provided with electron bombardment. Typically the electron impinges on the backside of the silicon wafer, that is, the side of the silicon wafer, on which the wafer is not processed.

According to embodiments described herein, which can be combined with other embodiments described herein, the opening for the exit of the electron beam is at least of a size corresponding to the cathode 110, at least of a size corresponding to 80 or 90% of the respective dimension of the housing 112, or of a size corresponding to the size of the housing 112, whereby a front surface (see, e.g., 113 in FIG. 1) can be omitted.

According to yet further embodiments, which can be combined with other embodiments described herein, the plasma electron source can be a linear plasma electron source, preferably of a length above 60 cm. A linear plasma electron source can be a source according to embodiments described herein.

By having a wide opening for the exit of the electron beam, the current reaching the target, that is, a silicon wafer, can be increased. Accordingly, the power supplied to the silicon wafer which is given by P=U*I can be increased and/or halt even for moderate electron beam energy. Thus it is according to typical embodiments possible to use cathode voltages in a range of −5 to −8 kV. Thereby, damage to the silicon wafer due to high energy electrons can be reduced. The increased power output maintains a sufficient heating of the silicon wafer without a significant damage to the wafer at the backside thereof.

According to embodiments for heating a silicon wafer, a metal foil, a web, or the like the electron beam from the plasma electron source and, in particular a linear plasma electron source can provide an efficient energy transfer or charge transfer since the electron beam can be well directed towards the desired target. According to embodiments described herein it is possible that at least 60%, for example, 70 or 80% of the energy provided to the source is transferred to the target.

For embodiments, wherein a plasma electron source is used for heating a silicon wafer the electrons provide the energy directly to the silicon wafer. Thereby, for example, the absorption of the energy in the silicon wafer is improved as compared to the absorption of electromagnetic radiation. Accordingly, the energy, which is provided at the wafer surface, can be reduced for generating the desired temperature According to embodiments described herein, a linear plasma electron source can be provided. The source includes a housing acting as a first electrode, the housing having side walls, a slit opening in the housing for trespassing of an electron beam, the slit opening defining a length direction of the source, a second electrode being arranged within the housing and having a first side facing the slit opening, the first side being spaced from the slit opening by a first distance, wherein the length of the electron source in the length direction is at least 5 times the first distance, and at least one gas supply for providing a gas into the housing, wherein the first electrode is the anode and the second electrode is the cathode.

According to yet further embodiments, the linear plasma electron source may have the length of the electron source in the length direction being at least 20 times the first distance. Typically, as a further additional or alternative implementation the second electrode can have second further sides facing the side walls, and third further sides, wherein the side of the second electrode is spaced from the slit opening by a first distance (D), wherein the second further side of the second electrode and the third further sides being spaced from the housing by separation spaces being smaller than the first distance, and wherein the separation space between the second further side and the side wall is adapted for increasing from a non-operational state to an operational state by at least 1 mm.

According to even further embodiments, which can be combined with other embodiments described herein, the length of the housing in the length directions can be at least 1.5 m. Additionally or as a further modification, which can be combined with embodiments described herein, the second electrode can include at least a material selected from the group consisting of: stainless steel, graphite, and CFC.

According to yet further embodiments, which can be combined with other embodiments described herein, the source can further include a first support member for supporting the second electrode at a fixed position with respect to the housing; and at least one second support member for supporting the second electrode at a floating position with respect to the housing. Thereby, for example, the second support member can be floating in an opening in the housing. As additionally or alternative implementations, the second electrode can include at least a material selected from the group consisting of: stainless steel and copper, and wherein the opening has a flouting length extending in the length direction of at least 3 mm or the second electrode can include at least a material selected from the group consisting of: graphite and CFC, and wherein the opening has a floating length extending in the length direction of at least 1 mm.

According to yet further embodiments, which can be combined with other embodiments described herein, the opening in the housing can be a slit opening for floating movement of the at least one second support member with a floating length of at least 1 mm. For embodiments having an opening in the housing, it is optionally possible that the source includes at least one seal for reducing the gas flow in the opening for floating movement of the at least one second support member. As a further example, which might additionally or alternatively be provided the at least one second support member can be at least two second support members.

According to yet further embodiments, which can be combined with other embodiments described herein, the second electrode can be connected to a power supply for providing a high voltage to the second electrode. As an example, the second electrode and a power supply can be connected with an electrical connections being arranged through the fixed support member.

According to yet further typical embodiments, which can be combined with other embodiments described herein, the second electrode can be a rectangular cross-section.

According to even further embodiments, which can be combined with other embodiments described herein, the at least one gas supply can be a plurality of gas supplies with a distance along the length direction of at least 200 mm. Thereby, the at least one gas supply may include a gas conduit for the at least one gas supply; and a gas distribution area or space in communication with the gas conduit and adjacent to the housing for improving the uniformity of the gas pressure along the length direction. As a further example, a wall separating the gas distribution space and the housing can have a plurality of openings for insertion of the gas in the housing.

According to other embodiments, which can be combined with other embodiments described herein, the linear plasma electron source may further include further support members supporting the second electrode at the third further sides. As a further option the further support members can be adapted for floating movement with respect to the housing.

According to even further embodiments, which can be combined with other embodiments described herein, the second electrode can have a main body and an outer layer. Thereby, as an example, the main body can include at least a material selected from the group consisting of: stainless steel, aluminum, copper, and mixtures thereof; and the outer layer includes at least a material selected from the group consisting of: graphite, CFC, and mixtures thereof. Alternatively or additionally, the outer layer can encircle the main body or the outer layer can be provided at the first side of the second electrode.

According to yet other embodiments, which can be combined with other embodiments described herein, the source may further include a charged particle emission grid being recessed from the slit opening towards the inside of the housing.

Further implementations, which can be combined with other embodiments described herein, have a slit wherein the slit opening can have a height, that is, a direction perpendicular to the length direction, being at least 50% of the height of the housing. For example, the height of the slit opening can correspond essentially to the height of the housing.

According to other modifications, which can be combined with other embodiments described herein, the source may include at least one slit height adjusting plate and/or a movable shutter for selectively blocking the charged particle beam.

According to some embodiments, which can be combined with other embodiments described herein, the first side of the second electrode can have a height that is a dimension perpendicular to the length direction, being at least 1 to 30 cm or even 15 to 30 cm.

Further modifications, which can be combined with other embodiments described herein, can include a focusing lens for focusing the linear charged particle beam towards the optical plane extending through the slit opening. Thereby, for example, the focusing lens can include a coil wound around the housing, a permanent magnet extending along the length direction, and/or at least two electrodes.

According to some embodiments, which can be combined with other embodiments described herein, the at least one gas supply can include a plurality gas conduits, and at least one valve, and wherein the plurality of gas conduits are similar to provide a cascade of gas supplies. Thereby, for example, each of the gas supplies can provide a valve.

According to even further embodiments, which can be combined with other embodiments described herein, the at least one gas supply can be controlled by a controller being adapted for sensing the current supplied to the cathode and having a reaction time of 100 ms or faster, the controller can be connected to a main control unit for receiving a desired current value, the power supply can include an arc rejection with a reaction time of 10 ms or faster, and/or the power supply can be connected to a main control unit for receiving a desired voltage value.

According to other embodiments, a method of manufacturing a linear plasma electron source is provided. The method includes manufacturing a housing acting as a first electrode and having a slit opening defining a length direction; providing a second electrode in the housing with a first side adapted for facing the slit opening and being spaced from the slit opening by a first distance, wherein the second electrode has second further sides adapted for facing side walls, and third further sides adapted for facing the housing; defining predetermined separation spaces between the second further side of the second electrode and the housing side ails and the third further sides and the housing; mounting the second electrode in the housing with a length of the second electrode in the length direction being at least 1 mm smaller than the predetermined separation space between the second further side and the housing side wall; and connecting at least one gas supply to the housing.

Thereby, as one optional modification, the second electrode can be fixedly mounted to the housing at a first position and mounted to the housing with a floating bearing at further positions. For example, the first position can be located substantially at the center of the second electrode and/or the housing.

According to some embodiments, which can be combined with other embodiments described herein, the method may include sealing the floating bearing and/or providing a sealed electrical connection for the second electrode.

According to yet other embodiments an evaporation apparatus for evaporating a material to be deposited is provided. The evaporation apparatus includes at least one evaporation crucible having a body with an area for receiving the material to be deposited at one side; a linear electron source being positioned adjacent to the evaporation crucible for impingement of an electron beam on another side. The linear electron source includes a housing acting as a first electrode, the housing having side walls; a slit opening in the housing for trespassing of a electron beam, the slit opening defining a length direction of the source; a second electrode being arranged within the housing and having a first side facing the slit opening; and at least one gas supply for providing a gas into the housing.

Thereby, typically, the material for manufacturing the evaporation crucible body can be selected from the group consisting of: a metallic boride, a metallic nitride, a metallic carbide, a non-metallic boride, a non-metallic nitride, a non-metallic carbide, nitrides, borides, a ceramic material, graphite, $TiB_2$, BN, $B_4C$, SiC, $Al_2O_3$ and combinations thereof.

According to yet further embodiments, which can be combined with other embodiments described herein, the material for manufacturing the evaporation crucible body can have A resistance of 2000 μΩ·cm and above or of 300 μΩ·cm or below.

According to even further embodiments, which can be combined with other embodiments described herein, the evaporation apparatus can include a crucible support. For example, the crucible support can have, a contact area to the crucible of 0.2 mm$^2$ to 10 mm$^2$, and/or a thermal conductivity of 200 (W/m·K) or lower.

According yet other embodiments, which can be combined with other embodiments described herein, a linear electron source according to any of the embodiments described herein can be used for the evaporation apparatus.

According to another embodiment, a method of charging a web or foil is provided. The method includes guiding a web or foil having a thickness of 10 μm or larger with at least one roller; providing a linear electron source having a housing acting as an anode, the housing having side walls; a slit opening in the housing for trespassing of a linear electron beam, the slit opening defining a length direction of the source; a cathode being arranged within the housing and having a first side facing the slit opening; at least one gas supply for providing a gas into the housing; and a power supply for providing a high voltage between the anode and the cathode; and emitting the linear electron beam, wherein the high voltage is adjusted for providing an electron energy to implant electrons of the electron beam within the web or foil. As an example, the foil or web having may typically have thickness of at least 25 μm is guided.

According to some embodiments, which can be combined with other embodiments described herein, the electrons can be implanted to an implantation depth of at least 20% of the thickness of the foil and/or to an implantation depth is adjusted to be between 40% and 80% of the thickness of the foil. As further implementations, which can be combined with other embodiments described herein, the high voltage can be adjusted between −4 kV and −15 kV, the providing of gas can be controlled with a controller having a reaction time of 100 ms or faster, and/or arcing can be detected and the detection of arcing switches the high voltage with a reaction time of 10 ms.

According to yet further embodiments, which can be combined with other embodiments described herein, the height of the slit opening in a direction perpendicular to the length direction can be at least 50% of the corresponding height of the housing.

According to even further embodiments, which can be combined with other embodiments described herein, the linear electron source is provided such that the distance between the slit opening and the web or foil can be 20 mm or below. Generally, for applications described herein, in particular for large heights of the slit opening of 50%, 80% or even 90% the height of the housing, it can be possible to position the linear electron source substantially directly at the target to be bombarded with electrons.

According yet other embodiments, which can be combined with other embodiments described herein, a linear electron source according to any of the embodiments described herein can be used for implanting charge.

According to another embodiment, which can be combined with other embodiments described herein, a method of heating or cleaning a web or foil is provided. The method includes providing a linear plasma electron source having a housing acting as an anode, the housing having side walls; a slit opening in the housing for trespassing of an electron beam, the slit opening defining a length direction of the source, a cathode being arranged within the housing and having a first side facing the slit opening; at least one gas supply for providing a gas into the housing; and a power supply for providing a high voltage between the anode and the cathode; guiding the web or foil movably in front of the slit opening; and emitting a linear electron beam from the linear plasma electron source.

Thereby, according to some embodiments, which can be combined with other embodiments described herein, the high voltage can be adjusted between −4 kV and −15 kV. According to yet further modifications, which can be combined with other embodiments described herein, the providing of gas can be controlled with a controller having a reaction time of 100 ms or faster, and/or arcing can be detected and the detection of arcing switches the high voltage with a reaction time of 10 ms.

According to some embodiments, which can be combined with other embodiments described herein, a width of the opening can be at least 50% or even at least 80% of corresponding width of the housing. Typically, for example at least 20% of the power provided by the power supply can be provided to the web or foil or at least 60% of the power provided by the power supply is provided to the web or foil.

According to even further embodiments, which can be combined with other embodiments described herein, the plasma electron source can be provided such that the distance between the opening and the web or foil is 50 mm or below or such that the distance between the opening and the web or foil is 10 mm or below.

According to different embodiments, which can be combined with other embodiments described herein, the web or foil can be a metal foil. Thereby, for example, it is typically possible to movie the metal foil being guided by at least one roller along the linear plasma electron source with a velocity of at least 1 cm/min. Further, additionally or alternatively, the power absorption of the electron beam can be used for preheating of the metal foil or the power absorption of the electron beam can be used for cleaning the metal foil. For example, the power absorption may crack molecule remainders on the metal foil. Alternatively, the web or foil can be a web foil. Thereby, for example, it is typically possible to move the web foil being guided by at least one roller along the plasma electron source with a velocity of at least 1 cm/min. Further, additionally or alternatively, the power absorption of the electron beam is used for cleaning of the web foil. As a typical option, the power absorption of the electron beam can be used for oil removal from the web foil. For example, the power absorption may cracks molecule remainders on the web foil.

According yet other embodiments, which can be combined with other embodiments described herein, a linear electron source according to any of the embodiments described herein can be used for heating or cleaning a web or foil.

According to another embodiment, a method of heating a silicon substrate is provided. The method includes providing a plasma electron source having a housing acting as an anode, the housing having side walls; an opening in the housing for trespassing of an electron beam, a cathode being arranged within the housing and having a first side facing the opening; at least one gas supply for providing a gas into the housing; and a power supply for providing a high voltage between the anode and the cathode; providing the silicon substrate in front of the opening; and emitting the electron beam to directly impinge on the silicon wafer.

Thereby, according to some embodiments, which can be combined with other embodiments described herein, at least 50% of the power provided by the power supply can be absorbed by the silicon substrate.

According to further embodiments, which can be combined with other embodiments described herein, the high voltage can be adjusted between −4 kV and −15 kV, the providing of gas can be controlled with a controller having a reaction time of 100 ms or faster, and/or arcing can be detected and the detection of arcing switches the high voltage with a reaction time of 10 ms According to yet other embodiments, which can be combined with other embodiments described herein, a width of the opening can be at least 50% or at least 80% of corresponding width of the housing. Typically, the plasma electron source can be provided such that the distance between the opening and the silicon substrate is 50 mm or below or such that the distance between the opening and the silicon substrate is 10 mm or below.

According to some embodiments, which can be combined with other embodiments described herein, the silicon substrate can be a silicon wafer. Typically, the method may include supporting the silicon substrate with a back-side of the wafer facing the electron source. As a further optional implementation, which can be combined with other embodiments described herein, the method may include rotating the silicon substrate during emission of the electron beam.

According yet other embodiments, which can be combined with other embodiments described herein, a linear electron source according to any of the embodiments described herein can be used for heating a silicon substrate.

While the foregoing is directed to embodiments of the invention, other and further embodiments of the invention may be devised without departing from the basic scope thereof, and the scope thereof is determined by the claims that follow.

The invention claimed is:

1. A linear plasma electron source comprising:
a housing acting as a first electrode, the housing having side walls;
a slit opening in the housing for trespassing of an electron beam, the slit opening defining a length direction of the source;
a second electrode being arranged within the housing to enable the second electrode to expand along its length, the second electrode having a first side facing the slit opening, the first side being spaced from the slit opening by a first distance, wherein the length of the electron source in the length direction is at least 5 times the first distance and is at least 70 cm; and
at least one gas supply for providing a gas into the housing, wherein the first electrode is the anode and the second electrode is the cathode.

2. The linear plasma electron source of claim 1, wherein the length of the electron source in the length direction is at least 20 times the first distance.

3. The linear plasma electron source of claim 1, wherein the second electrode has second further sides facing the side walls and third further sides, wherein the side of the second electrode is spaced from the slit opening by a first distance, wherein the second further side of the second electrode and the third further sides being spaced from the housing by separation spaces being smaller than the first distance, and wherein the separation space between the second further side and the side wall is adapted for increasing from a non-operational state to an operational state by at least 1 mm.

4. The linear plasma electron source of claim 1, wherein the length of the housing in the length directions is at least 1.5 m.

5. The linear plasma electron source of claim 1, wherein the second electrode includes at least a material selected from the group consisting of: stainless steel, graphite, and CFC.

6. The linear plasma electron source of claim 1, further comprising:
a first support member for supporting the second electrode at a fixed position with respect to the housing; and
at least one second support member for supporting the second electrode at a floating position with respect to the housing.

7. The linear plasma electron source of claim 6, wherein the second support member is floating in an opening in the housing.

8. The linear plasma electron source of claim 7, wherein the opening in the housing is a slit opening for floating movement of the at least one second support member with a floating length of at least 1 mm.

9. The linear plasma electron source of claim 7, wherein the second electrode and a power supply are connected with an electrical connection being arranged through the support member in the fixed position.

10. The linear plasma electron source of claim 1, wherein the second electrode has a rectangular cross-section.

11. A linear plasma electron source, comprising:
a housing acting as a first electrode, the housing having side walls;
a slit opening in the housing for trespassing of an electron beam, the slit opening defining a length direction of the source;
a second electrode being arranged within the housing to enable the second electrode to expand along its length, the second electrode having a first side facing the slit opening, the first side being spaced from the slit opening by a first distance, wherein the length of the electron source in the length direction is at least 5 times the first distance, wherein the first electrode is the anode and the second electrode is the cathode; and
at least one gas supply for providing a gas into the housing, the at least one gas supply further comprising:
a plurality of gas conduits with a distance along the length direction of at least 200 mm;
at least one gas distribution space in communication with the plurality of gas conduits and adjacent to the housing for improving the uniformity of the gas pressure along the length direction;
at least one valve, wherein the plurality of gas conduits are similar to provide a cascade of gas supplies, and wherein a wall separating the gas distribution space and the housing has a plurality of openings for insertion of the gas in the housing.

12. A linear plasma electron source comprising:
a housing acting as a first electrode, the housing having side walls;
a slit opening in the housing for trespassing of an electron beam, the slit opening defining a length direction of the source;
a second electrode being arranged within the housing to enable the second electrode to expand along its length, the second electrode having a first side facing the slit opening, the first side being spaced from the slit opening by a first distance, wherein the length of the electron source in the length direction is at least 5 times the first distance, wherein the second electrode has a main body and an outer layer; and
at least one gas supply for providing a gas into the housing, wherein the first electrode is the anode and the second electrode is the cathode.

13. The linear plasma electron source of claim 12, wherein the main body includes at least a material selected from the group consisting of: stainless steel, aluminum, copper, and mixtures thereof; and the outer layer includes at least a material selected from the group consisting of: graphite, CFC, and mixtures thereof.

14. The linear plasma electron source of claim 1, wherein the slit opening has a height, that is, a direction perpendicular to the length direction, being at least 50% of the height of the housing.

15. The linear plasma electron source of claim 14, wherein the height of the slit opening corresponds essentially to the height of the housing.

16. The linear plasma electron source of claim 1, wherein the first side of the second electrode has a height that is a dimension perpendicular to the length direction, being at least 1 to 30 cm.

17. The linear plasma electron source of claim 1, further comprising:
a focusing lens for focusing the linear charged particle beam towards an optical plane extending through the slit opening.

18. The linear plasma electron source of claim 17, wherein the focusing lens includes a coil wound around the housing.

19. The linear plasma electron source of claim 17, wherein the focusing lens includes a permanent magnet extending along the length direction.

20. The linear plasma electron source of claim 17, wherein the focusing lens includes two electrodes.

21. A linear plasma electron source comprising:
a housing acting as a first electrode, the housing having side walls;
a slit opening in the housing for trespassing of an electron beam, the slit opening defining a length direction of the source;
a second electrode being arranged within the housing to enable the second electrode to expand along its length, the second electrode having a first side facing the slit opening, the first side being spaced from the slit opening by a first distance, wherein the length of the electron source in the length direction is at least 5 times the first distance; and
at least one gas supply for providing a gas into the housing, wherein the first electrode is the anode and the second electrode is the cathode, wherein the at least one gas supply is controlled by a controller being adapted for sensing the current supplied to the cathode and having a reaction time of 100 ms or faster.

22. The linear plasma electron source of claim 9, wherein the power supply includes an arc rejection with a reaction time of 10 ms or faster.

23. A method of manufacturing a linear plasma electron source comprising:
manufacturing a housing acting as a first electrode and having a slit opening defining a length direction;
providing a second electrode in the housing with a first side adapted for facing the slit opening and being spaced from the slit opening by a first distance, wherein the length of the electron source in the length direction is at least 5 times the first distance and is at least 70 cm, and wherein the second electrode has second further sides adapted for facing side walls, and third further sides adapted for facing the housing;
defining predetermined separation spaces between the second further side of the second electrode and the housing side walls and the third further sides and the housing;
mounting the second electrode in the housing to enable the second electrode to expand along its length, the second electrode length in the length direction being at least 1 mm smaller than the predetermined separation space between the second further side and the housing side wall; and
connecting at least one gas supply to the housing.

* * * * *

UNITED STATES PATENT AND TRADEMARK OFFICE
CERTIFICATE OF CORRECTION

| | |
|---|---|
| PATENT NO. | : 8,294,115 B2 |
| APPLICATION NO. | : 12/272477 |
| DATED | : October 23, 2012 |
| INVENTOR(S) | : Klemm et al. |

It is certified that error appears in the above-identified patent and that said Letters Patent is hereby corrected as shown below:

In the Summary:

Column 2, Line 15, please delete "ails" and insert --walls-- therefor;

In the Detailed Description of the Invention:

Column 9, Line 2, please delete "very" and insert --vary-- therefor;

Column 21, Line 14, please delete "ails" and insert --walls-- therefor.

Signed and Sealed this
Twelfth Day of March, 2013

Teresa Stanek Rea
*Acting Director of the United States Patent and Trademark Office*